United States Patent
Kim et al.

(10) Patent No.: US 11,114,519 B2
(45) Date of Patent: Sep. 7, 2021

(54) ORGANIC LIGHT EMITTING DISPLAY DEVICE AND METHOD OF MANUFACTURING THE SAME

(71) Applicant: LG Display Co., Ltd., Seoul (KR)

(72) Inventors: Min-Joo Kim, Seoul (KR); Jung-Sun Beak, Gyeonggi-do (KR); Jin-Hee Jang, Seoul (KR); Nam-Yong Kim, Incheon (KR)

(73) Assignee: LG Display Co., Ltd., Seoul (KR)

( * ) Notice: Subject to any disclaimer, the term of this patent is extended or adjusted under 35 U.S.C. 154(b) by 103 days.

(21) Appl. No.: 16/020,991

(22) Filed: Jun. 27, 2018

(65) Prior Publication Data

US 2018/0323249 A1    Nov. 8, 2018

Related U.S. Application Data

(63) Continuation of application No. 14/980,151, filed on Dec. 28, 2015, now Pat. No. 10,032,844.

(30) Foreign Application Priority Data

Dec. 29, 2014  (KR) .................. 10-2014-0191883
Mar. 31, 2015  (KR) .................. 10-2015-0045410

(51) Int. Cl.
    *H01L 27/32*    (2006.01)
    *H01L 51/52*    (2006.01)

(52) U.S. Cl.
    CPC ...... *H01L 27/3276* (2013.01); *H01L 27/3248* (2013.01); *H01L 51/5228* (2013.01);
    (Continued)

(58) Field of Classification Search
    CPC .................................................. H01L 51/5228
    See application file for complete search history.

(56) References Cited

U.S. PATENT DOCUMENTS

2002/0057053 A1    5/2002   Hitoshi
2004/0080688 A1    4/2004   Ishida
(Continued)

FOREIGN PATENT DOCUMENTS

CN    100489629 C    5/2009
CN    103066212 A    4/2013

OTHER PUBLICATIONS

The First Office Action dated Mar. 5, 2018, from the State Intellectual Property Office of the People's Republic of China in counterpart Chinese application No. 2015-11019724.1. Note: US 2004/0080688 & 2013/0056784 cited therein is already of record.

*Primary Examiner* — Shaun M Campbell
*Assistant Examiner* — Aneta B Cieslewicz
(74) *Attorney, Agent, or Firm* — Morgan, Lewis & Bockius LLP

(57) ABSTRACT

An organic light emitting display device and a method of manufacturing the same are provided that may reduce the resistance of a second electrode and may prevent corrosion and metal migration of a pad electrode without adding a separate mask process, or while reducing the number of mask processes. In the organic light emitting display device, an auxiliary line is connected to a second electrode through an auxiliary electrode, which is provided in the same layer as a first electrode, and a pad cover electrode is configured to cover an upper surface and a side surface of a pad connection electrode so as to prevent the pad connection electrode connected to a pad from being exposed outward.

18 Claims, 22 Drawing Sheets

(52) U.S. Cl.
CPC ...... *H01L 27/3246* (2013.01); *H01L 51/5253* (2013.01); *H01L 2227/323* (2013.01)

(56) References Cited

U.S. PATENT DOCUMENTS

| | | | |
|---|---|---|---|
| 2005/0258426 A1 | 11/2005 | Shin | |
| 2009/0302751 A1* | 12/2009 | Hanawa | H01L 27/3276 |
| | | | 313/504 |
| 2010/0051958 A1* | 3/2010 | Izumida | H01L 51/5234 |
| | | | 257/72 |
| 2010/0127253 A1* | 5/2010 | Inoue | G02F 1/136286 |
| | | | 257/43 |
| 2013/0056784 A1 | 3/2013 | Lee et al. | |
| 2013/0256638 A1* | 10/2013 | Uesugi | H01L 51/5228 |
| | | | 257/40 |
| 2015/0060821 A1* | 3/2015 | Furuie | H01L 51/5253 |
| | | | 257/40 |
| 2016/0141549 A1 | 5/2016 | Odaka et al. | |

\* cited by examiner

ORGANIC LIGHT EMITTING DISPLAY DEVICE AND METHOD OF MANUFACTURING THE SAME

This is a continuation of U.S. application Ser. No. 14/980,151, filed Dec. 28, 2015, which claims the benefit of Korean Patent Applications No. 10-2014-0191883, filed Dec. 29, 2014 and No. 10-2015-0045410, filed Mar. 31, 2015, all of which are hereby incorporated by reference as if fully set forth herein.

BACKGROUND OF THE INVENTION

Field of the Invention

The present invention relates to a display device and a method of manufacturing the same, and more particularly to an organic light emitting display device and a method of manufacturing the same.

Discussion of the Related Art

An Organic Light Emitting Display (OLED) device is a self-illuminating device, and is receiving attention as a next-generation flat panel display device thanks to its low power consumption, fast response speed, high luminous efficacy, high brightness, and wide viewing angle.

OLED devices are divided into top emission type OLED devices and bottom emission type OLED devices according to the direction in which light emitted via organic light emitting elements penetrates. Recently, top emission type OLED devices have mainly been used because bottom emission type OLED devices cause deterioration in an aperture ratio.

FIG. 1 is a sectional view illustrating a related art top emission type organic light emitting display device.

The related art top emission type organic light emitting display device includes a substrate 10, a thin film transistor T, a passivation layer 20, a planarization layer 30, a first electrode 40, an auxiliary electrode 50, a bank 60, an organic emission layer 70, and a second electrode 80.

Although not illustrated in FIG. 1, gate lines and data lines are cross-formed on the substrate 10 to define a plurality of pixel areas, and the thin film transistor T is provided in each of the pixel areas.

The passivation layer 20 is provided over the entire surface of the substrate 10 so as to cover the thin film transistor T, and the planarization layer 30 covers the entire surface of the passivation layer 20.

The first electrode 40 is provided on the planarization layer 30 and is electrically connected to the thin film transistor T. In this case, the first electrode 40 may contain a high reflectance material, for example, an Ag alloy layer.

The auxiliary electrode 50 is provided in the same layer as the first electrode 40. The auxiliary electrode 50 is connected to the second electrode 80 and serves to reduce the resistance of the second electrode 80.

The bank 60 is provided at the boundary of each pixel area. The bank 60 is provided between the first electrode 40 and the auxiliary electrode 50 so as to insulate the first electrode 40 and the auxiliary electrode 50 from each other. The organic emission layer 70 is provided on the first electrode 40.

The second electrode 80 is provided over the entire surface of the substrate 10 and is connected to the auxiliary electrode 50. The second electrode 80 may be formed of a thin metallic material having a thickness of hundreds of angstroms (Å) or less.

In the related art top emission type organic light emitting display device described above, the resistance of the second electrode 80 may be somewhat increased because the second electrode 80 is thin. Although the second electrode 80 may be connected to the auxiliary electrode 50 as described above in order to reduce the resistance of the second electrode 80, there is a spatial limitation on any increase in the size of the auxiliary electrode 50 because the auxiliary electrode 50 needs to be provided in the same layer as the first electrode 40. Therefore, there is a limit to the extent to which the resistance of the second electrode 80 may be reduced.

In addition, although not illustrated in FIG. 1, when a source electrode 14 and a drain electrode 15 of the thin film transistor T are provided in the pixel area on the substrate 10, a pad electrode may be provided in a pad area on the substrate 10. However, the pad electrode is vulnerable to corrosion, and corrosion and metal migration may occur in the pad area during subsequent processing. Although a separate process for only the pad area may be added in order to prevent the corrosion and metal migration of the pad area, in this case, the efficiency of production of the display device may be deteriorated due to the addition of the process.

SUMMARY

Accordingly, the present invention is directed to an organic light emitting display device and a method of manufacturing the same that substantially obviate one or more problems due to limitations and disadvantages of the related art.

An object of the present invention is to provide an organic light emitting display device and a method of manufacturing the same, which may reduce the resistance of a second electrode and which may prevent corrosion and metal migration of a pad electrode without adding a separate mask process, or while reducing the number of mask processes.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display device comprises a substrate including a pixel area and a pad area; a thin film transistor provided in the pixel area of the substrate; a first electrode electrically connected to the thin film transistor; an organic emission layer provided on the first electrode; a second electrode provided on the organic emission layer; an auxiliary electrode connected to the second electrode, the auxiliary electrode being provided in the same layer as the first electrode; an auxiliary line connected to the auxiliary electrode and provided below the auxiliary electrode; a pad provided in the pad area of the substrate; a pad connection electrode provided on the pad; and a pad cover electrode provided on the pad connection electrode, wherein the pad cover electrode is provided to cover an upper surface and a side surface of the pad connection electrode so that the pad connection electrode is not exposed outward.

In another aspect, a method of manufacturing an organic light emitting display device comprises forming a thin film transistor in a pixel area of a substrate, and forming a pad in a pad area of the substrate; forming a planarization layer on the thin film transistor; forming a connection line, connected to the thin film transistor, and an auxiliary line, spaced apart from the connection line, on the planarization layer, and forming a pad connection electrode connected to the pad; forming a connection cover electrode so as to cover the connection line, forming an auxiliary cover electrode so as to cover the auxiliary line, and forming a pad cover electrode so as to cover the pad connection electrode; forming a protective layer in the pixel area, and forming a pad protective pattern in the pad area; forming a first electrode, connected to the connection line, and an auxiliary electrode, connected to the auxiliary line, on the protective layer; forming a bank configured to separate the first electrode and the auxiliary electrode from each other; forming an organic emission layer on the first electrode; and forming a second electrode, connected to the auxiliary electrode, on the organic emission layer.

In another aspect, a method of manufacturing an organic light emitting display device comprises forming a thin film transistor in a pixel area of a substrate, and forming a pad in a pad area of the substrate; forming a planarization layer on the thin film transistor; forming a connection line, connected to the thin film transistor, and an auxiliary line, spaced apart from the connection line, on the planarization layer, forming a pad connection electrode connected to the pad, and applying an auxiliary cover material over an entire surface of the substrate; forming a first protective layer in the pixel area and a second protective layer spaced apart from the first protective layer, and forming a pad protective pattern in the pad area; forming a first electrode on the first protective layer, forming an auxiliary electrode on the second protective layer, and etching the pad protective pattern so as to form a connection cover line, an auxiliary cover line, and a pad cover electrode; forming a bank configured to separate the first electrode and the auxiliary electrode from each other, and removing the pad protective pattern; forming an organic emission layer on the first electrode; and forming a second electrode, connected to the auxiliary electrode, on the organic emission layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF EXAMPLE EMBODIMENTS

Figure 1:
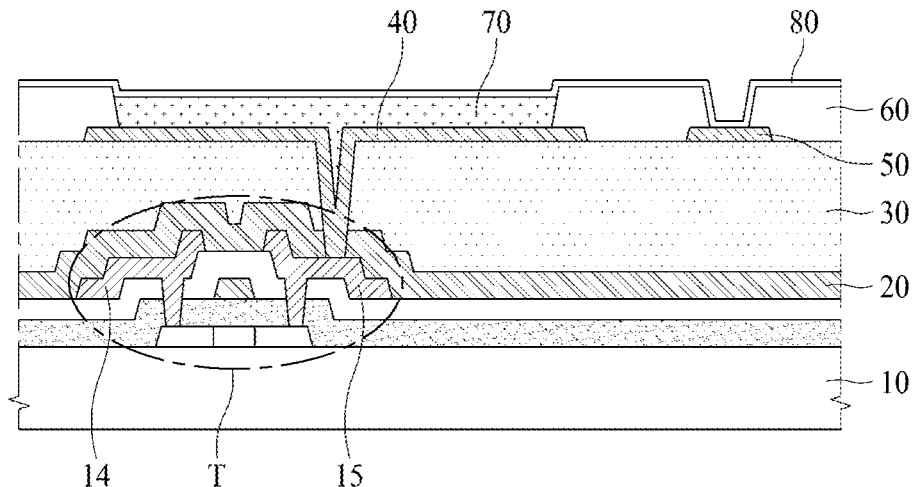
FIG. 1 is a sectional view illustrating a related art top emission type organic light emitting display device.

The advantages and features of the present invention and the way of attaining them will become apparent with reference to embodiments described below in detail in conjunction with the accompanying drawings. Embodiments, however, may be embodied in many different forms and should not be constructed as being limited to example embodiments set forth herein. Rather, these example embodiments are provided so that this disclosure will be through and complete and will fully convey the scope to those skilled in the art. The scope of the present invention should be defined by the claims.

Since the shape, size, ratio, angle, number, and the like of constituent elements illustrated in the drawings for the description of the embodiments of the present invention are given by way of example, the present invention is not limited to the illustrations. The same reference numbers will be used throughout the specification to refer to the same or like parts. In addition, in the following description of the present invention, a detailed description of associated known technology will be omitted when it may make the subject matter of the present invention rather unclear. In the case where the terms "comprises", "includes", "consists of" mentioned in this specification are used, they do not preclude the presence or addition of other constituent elements so long as the term "only" is not used. In the case where any constituent element is represented in the singular form, it is intended to include the plural forms as well unless the context clearly indicates otherwise.

In relation to the interpretation of a constituent element, the constituent element is interpreted as being characterized by an error range even if none is explicitly described.

In the case of a description related to a positional relationship, for example, when the positional relationship of two parts is described using "on", "above", "below", "beside", or the like, this means that one or more parts may be interposed between the two parts so long as the "directly" or "immediately" is not also used.

In the case of a description related to a temporal relationship, for example, when a temporal relationship is described using "after", "subsequent to", "next", "before", or the like, this means that two events may not be immediately successive so long as the term "directly" or "immediately" is not also used.

In addition, relative terms such as, for example, "first" and "second" may be used to describe various elements, the elements are not limited by these terms. The terms are merely used to distinguish any one element with another element. Thus, a first element mentioned in the following description may be a second element within the technical sprit of the present invention.

The respective features of the several embodiments of the present invention may be partially or wholly coupled or combined with one another, and various technical linkages and connections therebetween are possible. The respective embodiments may be implemented independently of one another, or may be implemented in conjunction with one another.

Reference will now be made in detail to the preferred embodiments of the present invention, examples of which are illustrated in the accompanying drawings.

Figure 2:
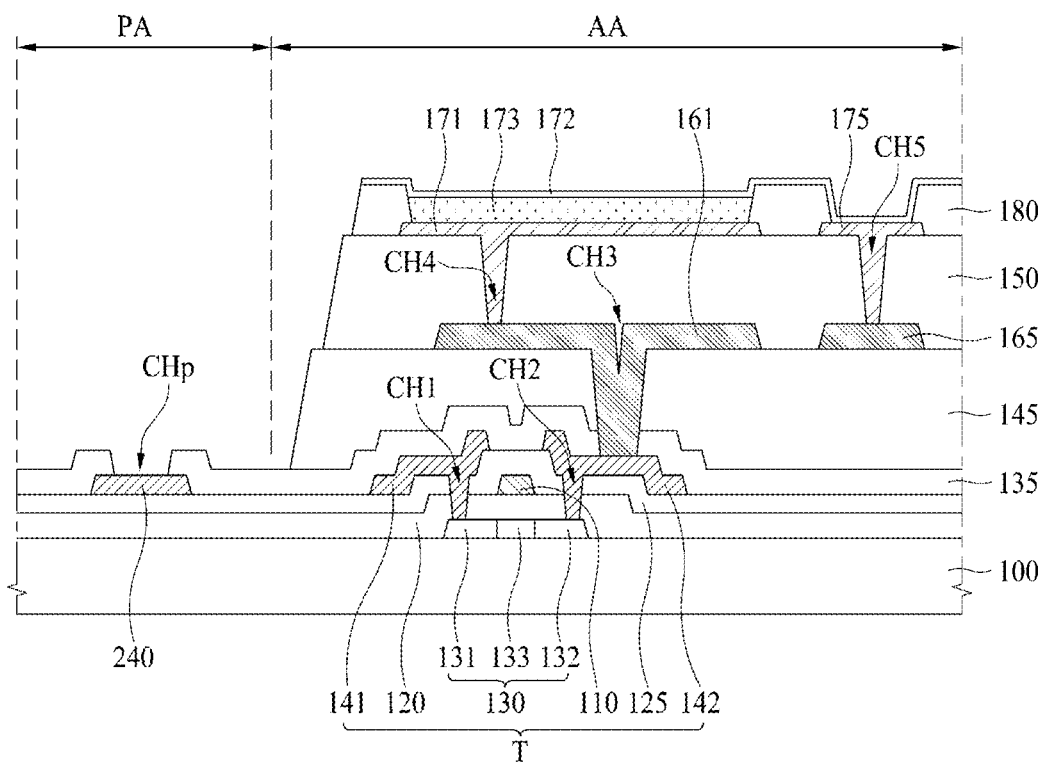
FIG. 2 is a sectional view illustrating an organic light emitting display device in accordance with a first embodiment of the present invention.

FIG. 2 is a sectional view illustrating an organic light emitting display device in accordance with a first embodiment of the present invention.

As can be seen from FIG. 2, the organic light emitting display device in accordance with the first embodiment of the present invention includes a pixel area AA and a pad area PA.

Provided in the pixel area AA on the substrate 100 are a thin film transistor T, a passivation layer 135, a planarization layer 145, a connection line 161, an auxiliary line 165, a protective layer 150, a first electrode 171, an auxiliary electrode 175, a bank 180, an organic emission layer 173, and a second electrode 172.

The thin film transistor T includes an active layer 130, a gate insulation film 120, a gate electrode 110, an interlayer insulation film 125, a source electrode 141, and a drain electrode 142.

The active layer 130 is provided on the substrate 100 so as to overlap the gate electrode 110. The active layer 130 may include an end region 131 located near the source electrode 141, an opposite end region 132 located near the drain electrode 142, and a central region 133 located between the end region 131 and the opposite end region 132. The central region 133 may be formed of a semiconductor material which is not doped with a dopant, and the end region 131 and the opposite end region 132 may be formed of a semiconductor material which is doped with a dopant.

The gate insulation film 120 is provided on the active layer 130. The gate insulation film 120 functions to insulate the active layer 130 and the gate electrode 110 from each other. The gate insulation film 120 covers the active layer 130 and is formed over the entire surface of the pixel area AA. The gate insulation film 120 may be formed of an inorganic insulation material, for example, a silicon oxide (SiOx) film, a silicon nitride (SiNx) film, or multiple layers thereof, without being limited thereto.

The gate electrode 110 is provided on the gate insulation film 120. The gate electrode 110 is provided so as to overlap the central region 133 of the active layer 130 with the gate insulation film 120 interposed therebetween. The gate electrode 110 may be a single layer or multiple layers including any one of molybdenum (Mo), aluminum (Al), chrome (Cr), gold (Au), titanium (Ti), nickel (Ni), neodymium (Nd), and copper (Cu), or alloys thereof, without being limited thereto.

The interlayer insulation film 125 is provided on the gate electrode 110. The interlayer insulation film 125 is provided over the entire surface of the pixel area AA including the gate electrode 110. The interlayer insulation film 125 may be formed of the same inorganic insulation material as the gate insulation film 120, for example, a silicon oxide (SiOx) film, a silicon nitride (SiNx) film, or multiple layers thereof, without being limited thereto.

The source electrode 141 and the drain electrode 142 are spaced apart from each other on the interlayer insulation film 125. The gate insulation film 120 and the interlayer insulation film 125 described above include a first contact hole CH1 formed to expose a portion of the end region 131 of the active layer 130 and a second contact hole CH2 formed to expose a portion of the opposite end region 132 of the active layer 130. As such, the source electrode 141 is connected to the end region 131 of the active layer 130 through the first contact hole CH1, and the drain electrode 142 is connected to the opposite end region 132 of the active layer 130 through the second contact hole CH2.

The source electrode 141 and the drain electrode 142 may be a single layer or multiple layers including any one of molybdenum (Mo), aluminum (Al), chrome (Cr), gold (Au), titanium (Ti), nickel (Ni), neodymium (Nd), and copper (Cu), or alloys thereof, without being limited thereto.

The thin film transistor T, configured as described above, may be formed in each pixel area AA on the substrate 100. The configuration of the thin film transistor T is not limited to the above-described example, and may be altered in various ways in known configurations that may be easily implemented by those skilled in the art.

The passivation layer 135 is provided on the thin film transistor T. The passivation layer 135 is provided over the entire surface of the pixel area AA including the source electrode 141 and the drain electrode 142. The passivation layer 135 functions to protect the thin film transistor T. The passivation layer 135 may be formed of an inorganic insulation material, for example, a silicon oxide (SiOx) film or a silicon nitride (SiNx) film, without being limited thereto.

The planarization layer 145 is provided on the passivation layer 135. The planarization layer 145 functions to planarize the top of the substrate 100 provided with the thin film transistor T. The planarization layer 145 may be formed of, for example, an acryl resin, epoxy resin, phenolic resin, polyamide resin, or polyimide resin, without being limited thereto.

The passivation layer 135 and the planarization layer 145 described above include a third contact hole CH3 formed to expose the drain electrode 142. The drain electrode 142 and the connection line 161 are connected to each other through the third contact hole CH3.

The connection line 161 is provided on the planarization layer 145. The connection line 161 functions to connect the drain electrode 142 and the first electrode 171 to each other. The connection line 161 may be a single layer or multiple layers including any one of molybdenum (Mo), aluminum (Al), chrome (Cr), gold (Au), titanium (Ti), nickel (Ni), neodymium (Nd), and copper (Cu), or alloys thereof, without being limited thereto.

The auxiliary line 165 is provided in the same layer as the connection line 161. The auxiliary line 165 is spaced apart from the connection line 161. The auxiliary line 165 and the connection line 161 may be simultaneously formed via the same process, and may be formed of the same material. The auxiliary line 165 is connected to the auxiliary electrode 175.

The protective layer 150 is provided so as to cover the top of the connection line 161 and the auxiliary line 165. The protective layer 150 includes a fourth contact hole CH4 formed to expose a portion of the connection line 161 and a fifth contact hole CH5 formed to expose a portion of the auxiliary line 165. The protective layer 150 may be formed of, for example, an acryl resin, epoxy resin, phenolic resin, polyamide resin, or polyimide resin, without being limited thereto.

The first electrode 171 is provided on the protective layer 150. The first electrode 171 is provided in the pixel area AA on the substrate 100, and is electrically connected to the thin film transistor T. The first electrode 171 is connected to the connection line 161 exposed through the fourth contact hole CH4. Since the connection line 161 is connected to the drain electrode 142, the first electrode 171 is connected to the drain electrode 142 through the connection line 161.

The first electrode 171 serves as an anode or a cathode according to the type of thin film transistor T. In the present invention, the first electrode 171 functions as an anode of an organic light emitting element, and is formed of a transparent conductive material having a relatively large work-function value, for example, indium-tin-oxide (ITO) or indium-zinc-oxide (IZO). In addition, the first electrode 171 may be formed into at least two layers including a metal material having excellent reflection efficiency, for example, aluminum (Al), silver (Ag), and APC (Ag;Pb;Cu).

The auxiliary electrode 175 is provided in the same layer as the first electrode 171. The auxiliary electrode 175 and the first electrode 171 are spaced apart from each other. The auxiliary electrode 175 and the first electrode 171 may be simultaneously formed via the same process, and may be formed of the same material.

The auxiliary electrode 175 is connected to the auxiliary line 165 exposed through the fifth contact hole CH5. The auxiliary electrode 175 is provided so as to come into contact with the second electrode 172, in order to reduce the resistance of the second electrode 172 which will be described below. In addition, the auxiliary electrode 175 is provided so as to come into contact with the auxiliary line 165 described above, in order to reduce the resistance of the second electrode 172.

The bank 180 is located between the first electrode 171 and the auxiliary electrode 175, and functions to insulate the first electrode 171 and the auxiliary electrode 175 from each other. The bank 180 may be formed of a transparent organic film or a black organic film such as, for example, polyimide resin, acryl resin, and benzocyclobutene (BCB), without being limited thereto.

The organic emission layer 173 is provided on the first electrode 171. The organic emission layer 173 may have the configuration of hole transfer layer/emission layer/electron transfer layer, or the configuration of hole injection layer/hole transfer layer/emission layer/electron transfer layer/electron injection layer. In addition, the organic emission layer 173 may further include at least one functional layer in order to improve, for example, the luminous efficacy and/or lifespan of the emission layer.

The second electrode 172 is provided so as to cover the top of the organic emission layer 173 and the bank 180. The second electrode 172 extends to cover the bank 180 and is connected to the auxiliary electrode 175.

When the first electrode 171 serves as an anode, the second electrode 172 serves as a cathode. An extremely thin metallic material having a low work-function value may be used as the second electrode 172. For example, the second electrode 172 may be formed of a metallic material such as, for example, silver (Ag), titanium (Ti), aluminum (Al), molybdenum (Mo), or an alloy of silver (Ag) and magnesium (Mg). In addition, the second electrode 172 may be formed of the metallic materials described above having a thickness of hundreds of angstroms (Å) or less, for example, 200 Å or less. In this case, the second layer 172 may be a semi-transparent layer, and may be used as a substantially transparent cathode.

When the second electrode 172 is used as a transparent cathode, the second electrode 172 is thin, and therefore, the resistance thereof may be somewhat increased. In order to reduce the resistance of the second electrode 172, the second electrode is connected to the auxiliary electrode 175. However, since the auxiliary electrode 175 is provided in the same layer as the first electrode 171, there is a limitation in a space for the provision of the auxiliary electrode 175. That is, the resistance of the second electrode 172 may be reduced as the area of the auxiliary electrode 175 that is in contact with the second electrode 172 is increased. However, since the auxiliary electrode 175 may be disposed only in the region at which the first electrode 171 is not provided, there is a limit to the extent to which the size of the auxiliary electrode 175 can be increased, and consequently, there is also a limit to the extent to which the resistance of the second electrode 172 can be reduced.

In the first embodiment of the present invention, to solve the above-described problem, the auxiliary line 165 connected to the auxiliary electrode 175 is provided below the auxiliary electrode 175. Since the second electrode 172 is connected to both the auxiliary electrode 175 and the auxiliary line 165, the resistance of the second electrode 172 may be further reduced compared to the related art in which the second electrode 172 and the auxiliary electrode 175 are connected to each other.

Although not illustrated in FIG. 2, a seal may be additionally provided on the second electrode 172. The seal protects elements such as, for example, the organic light emitting element and the thin film transistor T from external shocks, and prevents the invasion of moisture.

Provided in the pad area PA on the substrate 100 are the gate insulation film 120, the interlayer insulation film 125, a pad 240, and the passivation layer 135.

The gate insulation film 120 extends from the pixel area AA and is provided over the entire surface of the pad area PA.

The interlayer insulation film 125 is disposed on the gate insulation film 120 and extends from the pixel area AA so as to be provided over the entire surface of the pad area PA.

The pad 240 is located in the pad area PA and is provided on the interlayer insulation film 125. The pad 240 may be formed at the same time as the source electrode 141 and the drain electrode 142 via the same process, and may be formed of the same material.

The passivation layer 135 extends from the pixel area AA so as to cover the entire surface of the pad area PA. However, the passivation layer 135 has a pad contact hole CHp formed to expose a portion of the pad 240. A portion of the upper surface of the pad 240 may be exposed outward through the pad contact hole CHp.

In this case, the pad 240 may be corroded by the etching solution that is used in a photo-mask process for forming the first electrode 171. In addition, when a pad connection electrode 261 is exposed to the outside atmosphere, the pad 240 may be exposed to moisture in the air, thereby being easily oxidized. Thereby, corrosion and metal migration may occur in the pad area PA of the organic light emitting display device.

In order to prevent the corrosion and metal migration of the pad area PA described above, although a separate process may be added to form the pad contact hole CHp after the first electrode 171 is formed, or the pad connection electrode 261 may be sealed using, for example, a clad, in this case, a photo-mask process may be added, resulting in deterioration in the efficiency of production. Therefore, in second to fourth embodiments of the present invention described below, an organic light emitting display device capable of preventing the corrosion of the pad area PA without the addition of a photo-mask process will be described.

Hereinafter, to compare the number of mask processes, a manufacturing method in accordance with the first embodiment of the present invention will first be described, and thereafter organic light emitting display devices and methods of manufacturing the same in accordance with the second to fourth embodiments of the present invention will be described.

Figure 3A:
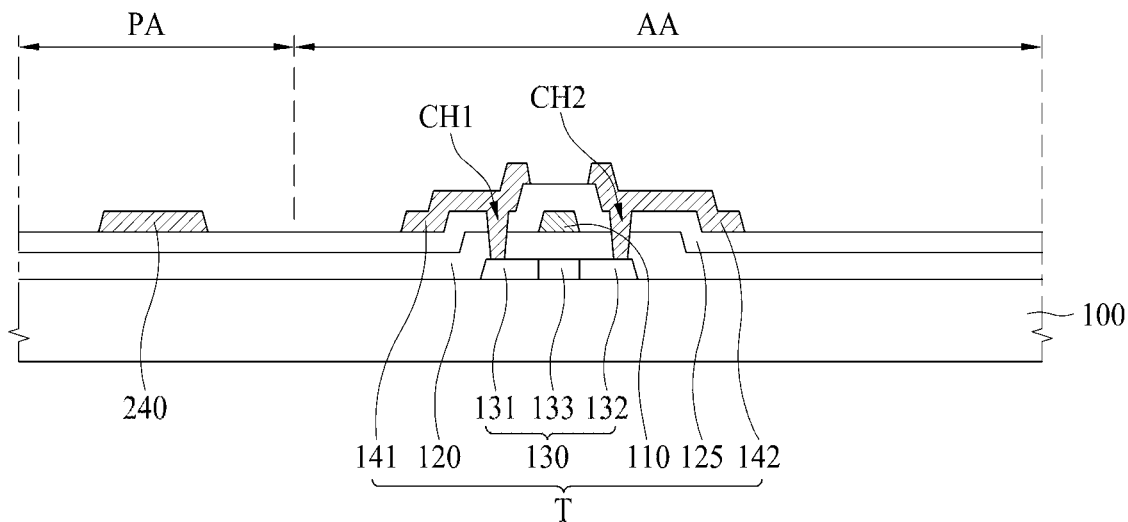
FIGS. 3A to 3C are sectional views illustrating a method of manufacturing the organic light emitting display device in accordance with the first embodiment of the present invention.
Figure 3B:
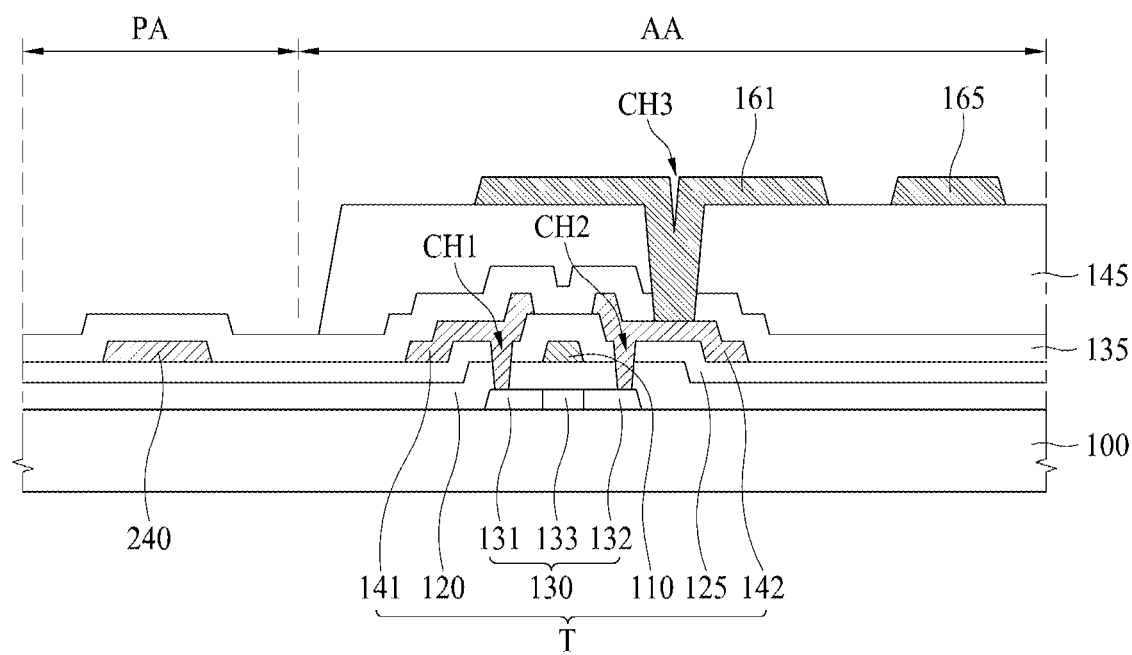
Figure 3C:
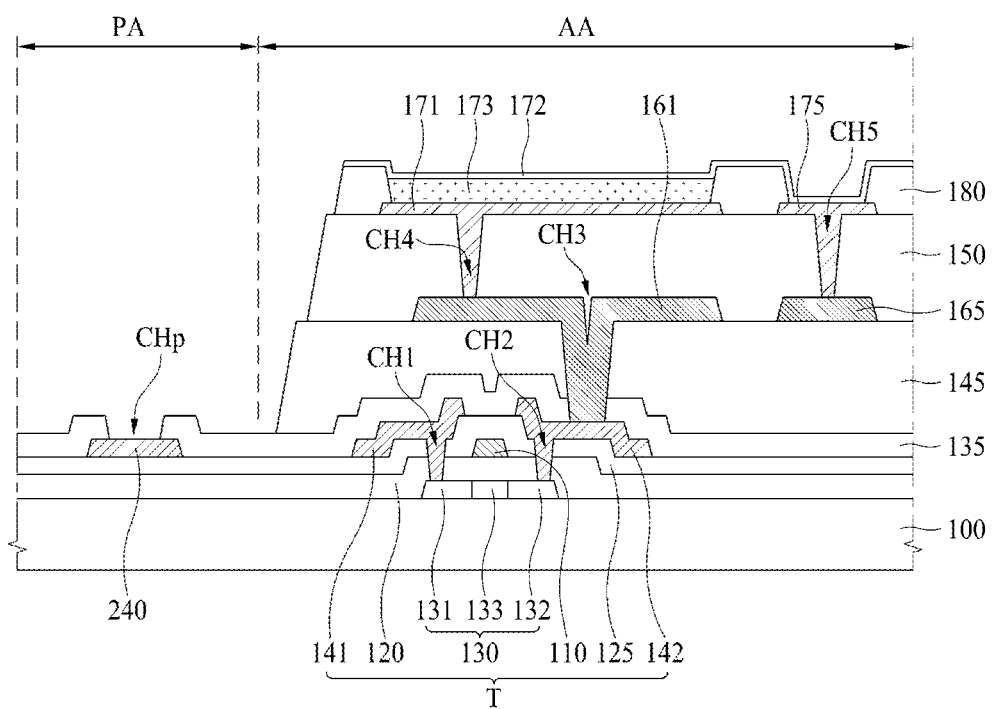

FIGS. 3A to 3C are sectional views illustrating a method of manufacturing the organic light emitting display device in accordance with the first embodiment of the present invention. The method relates to the manufacture of the above-described organic light emitting display device illustrated in FIG. 2. Thus, the same components are designated by the same reference numerals, and a repeated description with regard to the materials and configurations of the respective components is omitted.

First, as can be seen from FIG. 3A, the thin film transistor T is formed in the pixel area AA on the substrate 100, and the pad 240 is formed in the pad area PA on the substrate 100. The pad 240 is formed at the same time as the source electrode 141 and the drain electrode 142 of the thin film transistor T via the same process. For convenience of description, the process for forming the pad 240, the source electrode 141, and the drain electrode 142 is referred to as a first mask process.

Subsequently, as can be seen from FIG. 3B, the passivation layer 135 is formed over the entire surface of the pixel area AA including the thin film transistor T and the entire surface of the pad area PA including the pad 240. The passivation layer 135 is formed so as to have the third contact hole CH3, which exposes the drain electrode 142 of the thin film transistor T. Here, the entire surface of the pad area PA is covered with the passivation layer 135. The process for forming the passivation layer 135 having the third contact hole CH3 is referred to as a second mask process.

Subsequently, the planarization layer 145 is formed on the passivation layer 135 located in the pixel area AA. In this case, the planarization layer 145 is not formed in the pad area PA. The planarization layer 145 is formed so as to have the third contact hole CH3, which exposes the drain electrode 142 of the thin film transistor T. The process for forming the planarization layer 145 in the pixel area PA so as to have the third contact hole CH3 is referred to as a third mask process.

Subsequently, the connection line 161 connected to the thin film transistor T and the auxiliary line 165 spaced apart from the connection line 161 are formed on the planarization layer 145. The process for forming the connection line 161 and the auxiliary line 165 is referred to as a fourth mask process.

Subsequently, as can be seen from FIG. 3C, the protective layer 150 is formed in the pixel area AA. In this case, the protective layer 150 is not formed in the pad area PA. The protective layer 150 is formed so as to have the fourth contact hole CH4, which exposes the connection line 161, and the fifth contact hole CH5, which exposes the auxiliary line 165. The process for forming the protective layer 150 so as to have the fourth contact hole CH4 and the fifth contact hole CH5 is referred to as a fifth mask process.

Subsequently, the first electrode 171 connected to the connection line 161 and the auxiliary electrode 175 connected to the auxiliary line 165 are formed on the protective layer 150. The first electrode 171 and the auxiliary electrode 175 are spaced apart from each other. The process for forming the first electrode 171 and the auxiliary electrode 175 is referred to as a sixth mask process.

To form the first electrode 171 and the auxiliary electrode 175, a process for etching a metal material, for example, ITO/Ag alloy/ITO using an etching solution is performed. Here, when the pad 240 is exposed outward, the pad 240 may be corroded by the etching solution.

However, when the passivation layer 135 covers the entire surface of the pad 240 as in the first embodiment of the present invention, the pad 240 is not corroded because the passivation layer 135 protects the pad 240 from the etching solution. However, in this case, a separate mask process for forming the pad contact hole CHp to expose a portion of the upper surface of the pad 240, i.e. a seventh mask process is added as will be described below.

Subsequently, as described above, the pad contact hole CHp is formed in the passivation layer 135 provided in the pad area PA to expose a portion of the upper surface of the pad 240. The process for forming the pad contact hole CHp is referred to as the seventh mask process.

Subsequently, the bank 180 is formed to separate the first electrode 171 and the auxiliary electrode 175 from each other. The process for forming the bank 180 is referred to as an eighth mask process.

Finally, the organic emission layer 173 is formed on the first electrode 171, and the second electrode 172 is formed on the organic emission layer 173. In this case, the second electrode 172 extends along the bank 180 and is connected to the auxiliary electrode 175.

As described above, in the first embodiment of the present invention, a total of eight photo-masks are used from the process for forming the source electrode 141 and the drain electrode 172 to the process for forming the bank 180.

Figure 4:
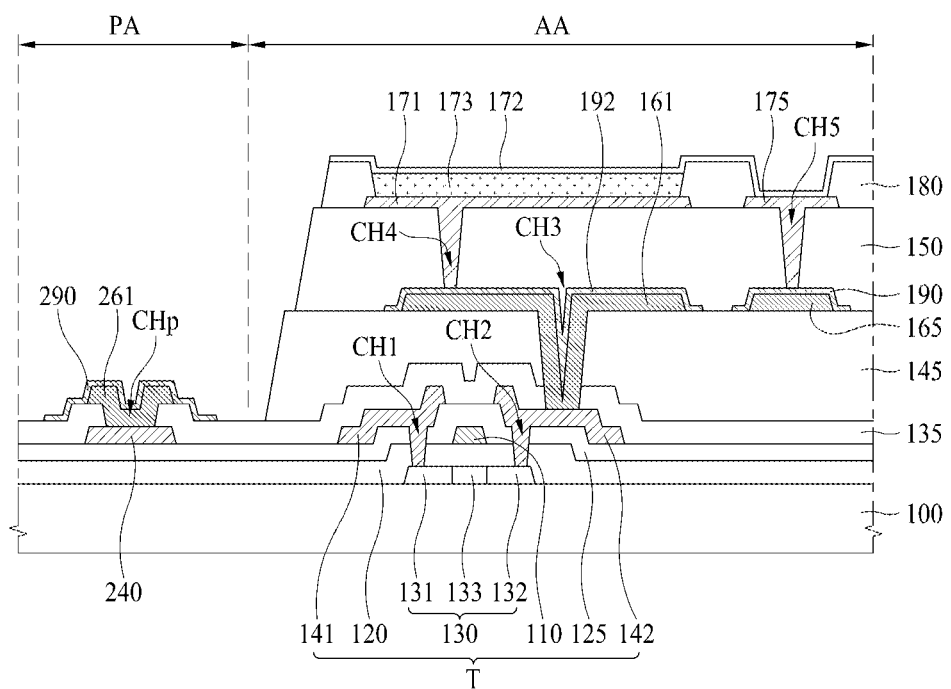
FIG. 4 is a sectional view illustrating an organic light emitting display device in accordance with a second embodiment of the present invention.

FIG. 4 is a sectional view illustrating an organic light emitting display device in accordance with a second embodiment of the present invention. The organic light emitting display device in accordance with the second embodiment of the present invention is substantially the same as the above-described first embodiment of the present invention except that a connection cover line 192 is provided on the connection line 161, an auxiliary cover line 190 is provided on the auxiliary line 165, and a pad connection electrode 261 and a pad cover electrode 290 are provided on the pad 240. Thus, the same components are designated by the same reference numerals, and a repeated description with regard to the materials and configurations of the respective components is omitted.

In the second embodiment of the present invention, the thin film transistor T, the passivation layer 135, the planarization layer 145, the connection line 161, the connection cover line 192, the auxiliary line 165, the auxiliary cover line 190, the protective layer 150, the first electrode 171, the auxiliary electrode 175, the bank 180, the organic emission layer 173, and the second electrode 172 are provided in the pixel area AA on the substrate 100.

The connection cover line 192 is provided on the connection line 161. The connection cover line 192 is provided to cover the upper surface and side surface of the connection line 161. In this case, the extent of oxidation of the connection cover line 192 may be smaller than the extent of oxidation of the connection line 161, and thus the upper surface of the connection line 161 is not easily corroded. The connection cover line 192 may be formed of, for example, indium-tin-oxide (ITO) or indium-zinc-oxide (IZO).

The auxiliary cover line 190 is provided in the same layer as the connection cover line 192. The auxiliary cover line 190 and the connection cover line 192 are spaced apart from each other. The auxiliary cover line 190 is provided on the auxiliary line 165 and is configured to cover the upper surface and side surface of the auxiliary line 165.

The auxiliary cover line 190 and the connection cover line 192 may be simultaneously formed via the same process, and may be formed of the same material. As such, the extension of oxidation of the auxiliary cover line 190 may be smaller than the extent of oxidation of the auxiliary line 165, and thus the upper surface of the auxiliary line 165 is not easily corroded.

The gate insulation film 120, the interlayer insulation film 125, the pad 240, the passivation layer 135, the pad connection electrode 261, and the pad cover electrode 290 are provided in the pad area PA on the substrate 100.

The pad 240 is located in the pad area PA and is provided on the interlayer insulation film 125.

The passivation layer 135 extends from the pixel area AA so as to cover the entire surface of the pad area PA. The passivation layer 135 has the pad contact hole CHp formed to expose a portion of the pad 240.

The pad connection electrode 261 is provided on the passivation layer 135 so as to overlap the pad 240. The pad connection electrode 261 is connected to the pad 240 through the pad contact hole CHp. The pad connection electrode 261 may be formed at the same time as the connection line 161 and the auxiliary line 165 via the same process, and may be formed of the same material.

The pad cover electrode 290 is provided on the pad connection electrode 261. The pad cover electrode 290 covers the side surface and upper surface of the pad connection electrode 261 so that the pad connection electrode 261 is not exposed outward. In addition, the pad cover electrode 290 covers a portion of the passivation layer 135 that is in contact with the pad connection electrode 261. As such, the side surface and upper surface of the pad connection electrode 261 may be completely sealed by the pad cover electrode 290. The pad cover electrode 290 and the auxiliary cover line 190 may be simultaneously formed via the same process, and may be formed of the same material.

According to the second embodiment of the present invention, since the pad cover electrode 290 is provided on the pad 240 so as to cover the pad 240, the corrosion and metal migration of the pad area PA caused by the etching solution used in the subsequent photo-mask process may be prevented. Thereby, the reliability of the organic light emitting display device may be improved.

FIGS. 5A to 5G are sectional views illustrating a method of manufacturing the organic light emitting display device in accordance with the second embodiment of the present invention. Thus, the same components are designated by the same reference numerals, and a repeated description with regard to the materials and configurations of the respective components is omitted.

Figure 5A:
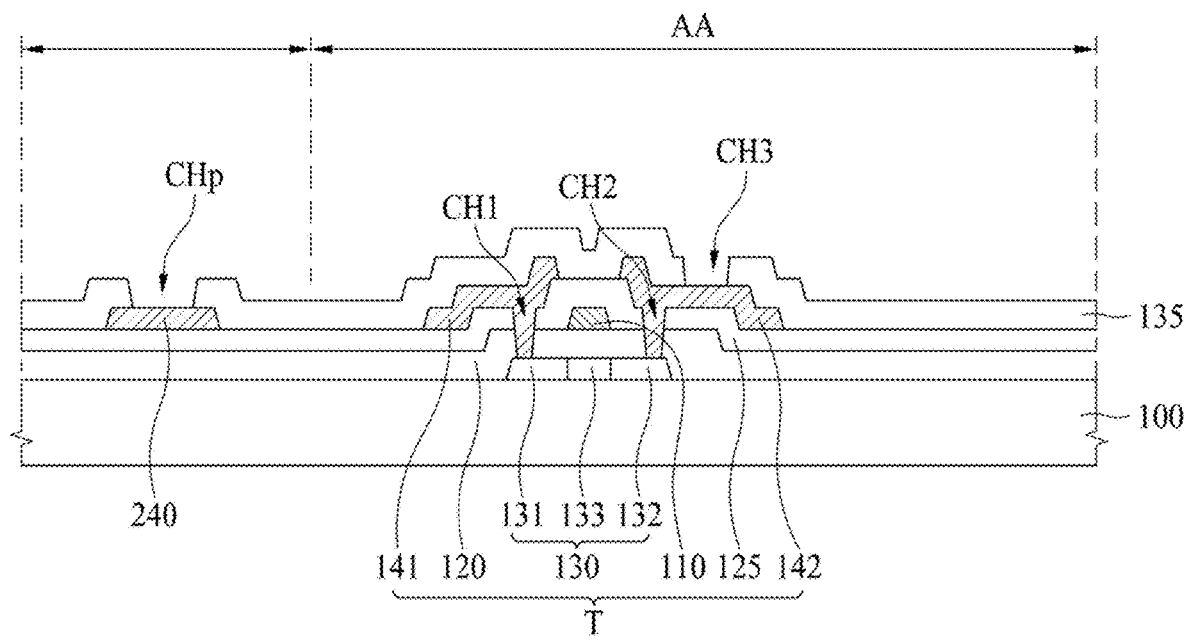
FIGS. 5A to 5G are sectional views illustrating a method of manufacturing the organic light emitting display device in accordance with the second embodiment of the present invention.

First, as illustrated in FIG. 5A, through the use of the first mask process, the source and drain electrodes 141 and 142 of the thin film transistor T are formed in the pixel area AA on the substrate 100, and simultaneously the pad 240 is formed in the pad area PA on the substrate 100.

Subsequently, through the use of the second mask process, the passivation layer 135 is formed over the entire surface of the pixel area AA including the thin film transistor T and the entire surface of the pad area PA including the pad 240. In this case, the passivation layer 135 has the third contact hole CH3 formed to expose the drain electrode 142 of the thin film transistor T and the pad contact hole CHp formed to expose the pad 240.

Figure 5B:
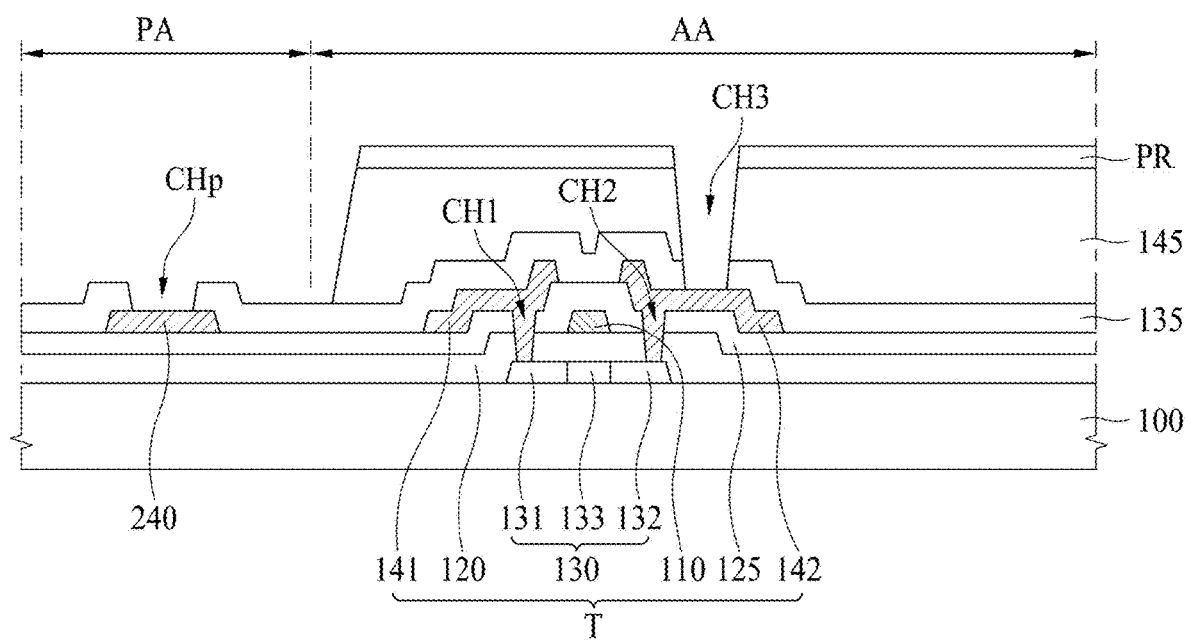

Subsequently, as illustrated in FIG. 5B, the planarization layer 145 is formed on the passivation layer 135 located in the pixel area PA using a photoresist pattern PR, which is formed via the third mask process. At this time, the third contact hole CH3 is formed through the planarization layer 145 located in the pixel area AA excluding the pad area PA, so as to expose the drain electrode 142.

Figure 5C:
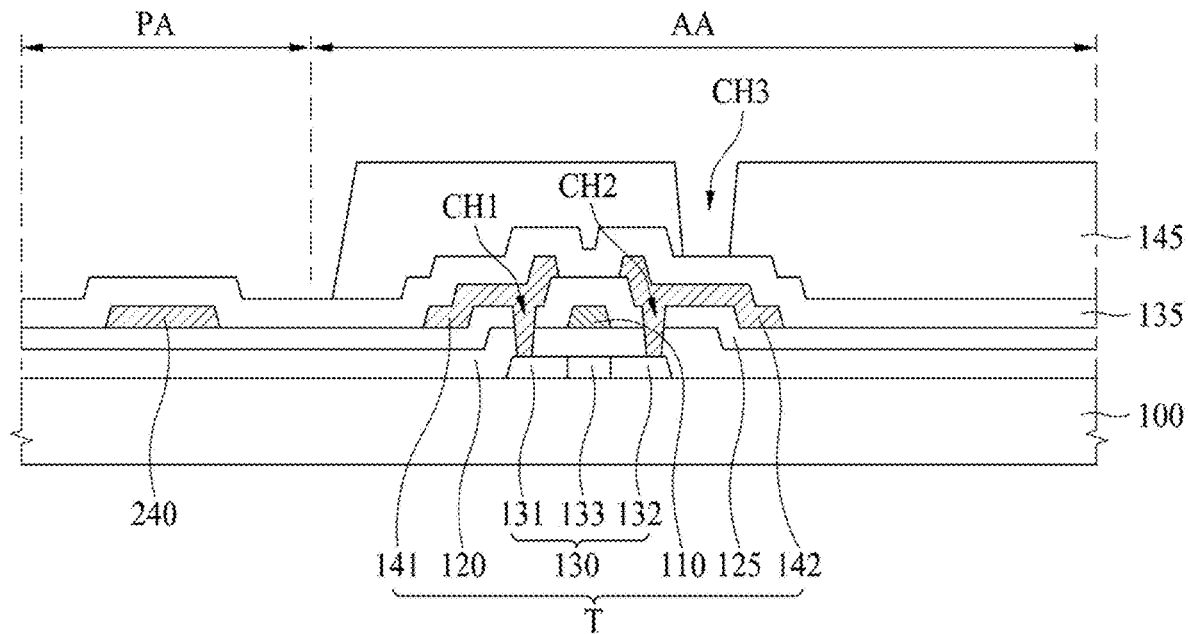
Figure 5D:
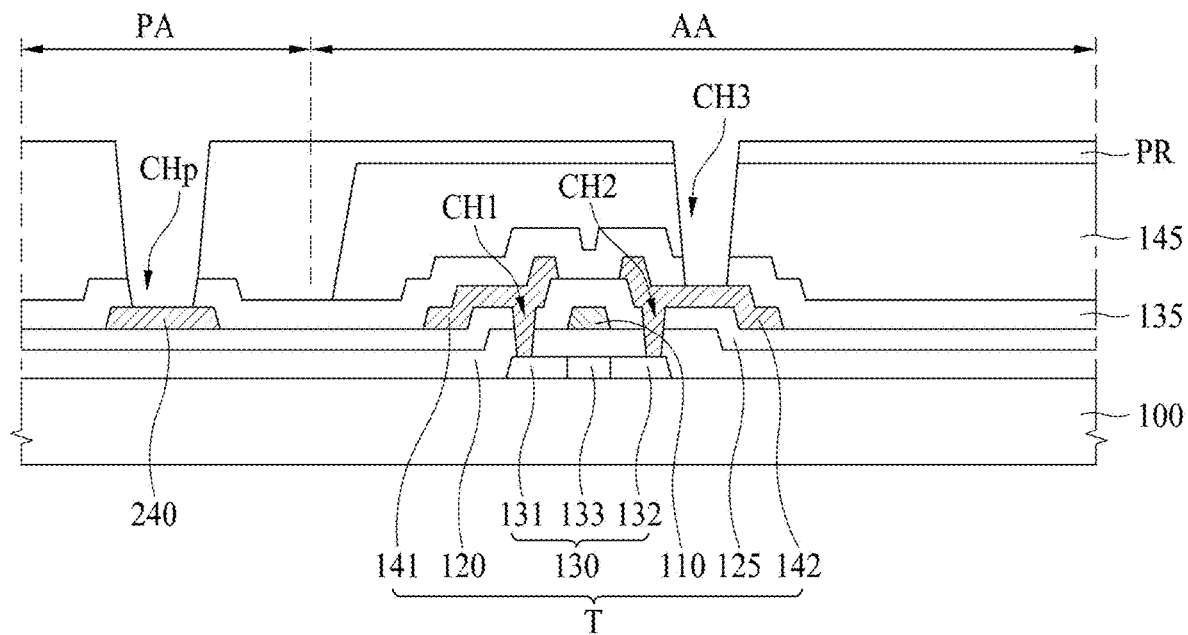

Meanwhile, although FIGS. 5A and 5B illustrate that the pad contact hole CHp is formed in the second mask process and the planarization layer 145 is formed in the third mask process by way of example, the planarization layer 145 may be formed in the second mask process and the pad contact hole CHp may be formed in the third mask process, as illustrated in FIGS. 5C and 5D.

Specifically, as illustrated in FIG. 5C, the passivation layer 135 is formed over the entire surface of the substrate 100 so as to cover the source and drain electrodes 141 and 142 and the pad 240 formed via the first mask process.

Subsequently, the planarization layer 145 is formed on the passivation layer 135 located in the pixel area PA through the use of the second mask process. At this time, the planarization layer 145 located in the pixel area AA excluding the pad area PA has the third contact hole CH3 formed to expose the drain electrode 142.

Subsequently, as illustrated in FIG. 5D, the passivation layer 135 is patterned using a photoresist pattern PR formed via the third mask process. As such, the pad contact hole CHp is formed in the passivation layer 135 so as to expose the pad 240, and the third contact hole CH3 is formed in the passivation layer 135 so as to expose the drain electrode 142.

Meanwhile, although the passivation layer 135, the planarization layer 145, the third contact hole CH3, and the pad contact hole CHp have been described as being formed via two mask processes by way of example, they may be formed via one mask process using a half-tone mask or a slit mask.

Figure 5E:
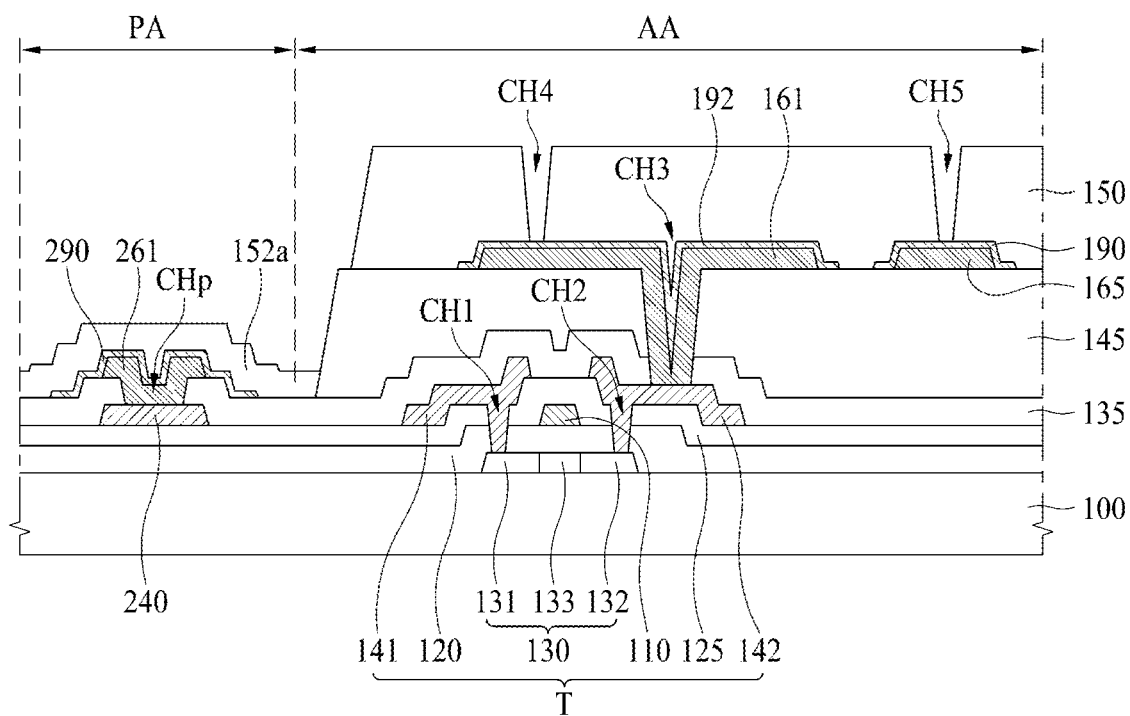

Subsequently, as illustrated in FIG. 5E, the connection line 161, the auxiliary line 165, and the pad connection electrode 261 are formed via the fourth mask process. In this case, the pad connection electrode 261 is connected to the pad 240 through the pad contact hole CHp.

Subsequently, the connection cover line 192 is formed to cover the connection line 161 and the auxiliary cover line 190 is formed to cover the auxiliary line 165 via the fifth mask process. In addition, the pad cover electrode 290 configured to cover the pad connection electrode 261 is formed at the same time as the connection cover line 192 and the auxiliary cover line 190.

Subsequently, the protective layer 150 is formed in the pixel area AA and the pad protective pattern 152a is formed in the pad area PA, through the use of the sixth mask process. In this case, the protective layer 150 and the pad protective pattern 152a may be formed using a half-tone mask. The half-tone mask is a mask having a light shielding portion, a transparent portion, and a semi-transparent portion. The light shielding portion is a portion that shields light, the transparent portion is a portion that transmits light, and the semi-transparent portion is a portion that transmits less light than the transparent portion. When using the half-tone mask, differential amounts of light are applied, which enables the formation of patterns having different heights. Thereby, the pad protective pattern 152a may be formed in the pad area PA and the protective layer 150 may be formed in the pixel area AA.

Figure 5F:
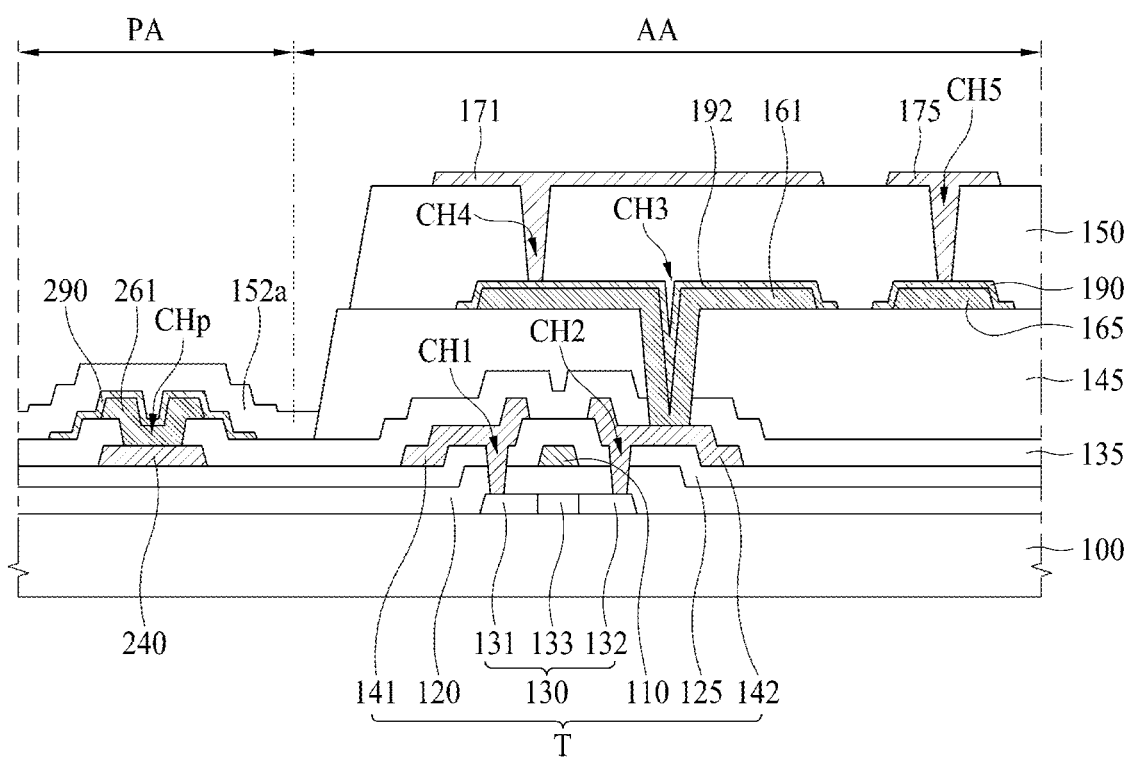

Subsequently, as illustrated in FIG. 5F, the first electrode 171 and the auxiliary electrode 175 are formed over the entire surface of the substrate 110, through the use of the seventh mask process. In this case, to form the first electrode 171 and the auxiliary electrode 175, the process for etching a metal material, for example, ITO/Ag alloy/ITO using an etching solution is performed. Since the pad protective pattern 152a covers the pad cover electrode 290, the pad area PA is not corroded.

Figure 5G:
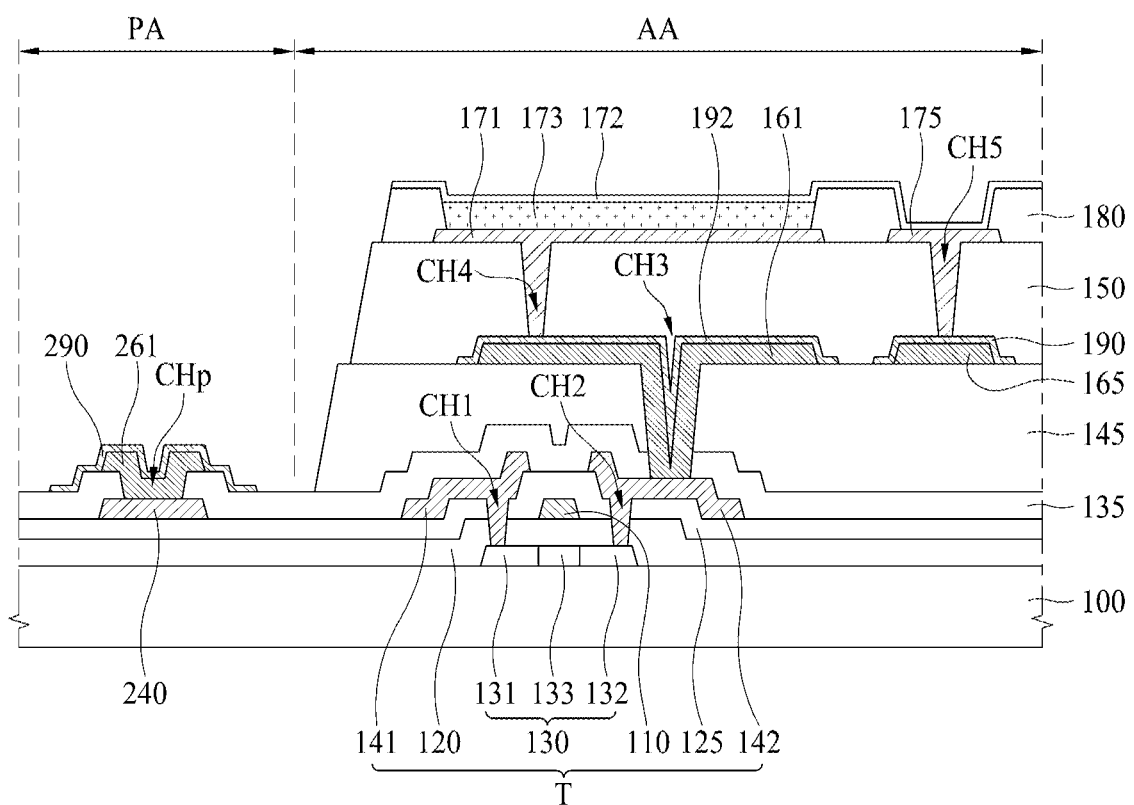

Subsequently, as illustrated in FIG. 5G, the bank 180 is formed to separate the first electrode 171 and the auxiliary electrode 175 from each other through the use of the eighth mask process.

Finally, the pad protective pattern 152a is removed from the pad area PA, the organic emission layer 173 is formed on the first electrode 171, and the second electrode 172 is formed on the organic emission layer 173.

Meanwhile, although the pad protective pattern 152a has been described as being removed after the bank is formed by way of example, the pad protective pattern 152a may be removed at the same time as a photoresist pattern, which is used as a mask when forming the first electrode 171, in the process for stripping the photoresist pattern. In this case, the pad protective pattern 152a is formed of a material that reacts to a stripping solution during the stripping process.

As described above, in the second embodiment of the present invention, a total of eight photo-masks are used from the process for forming the source electrode 141 and the drain electrode 172 to the process for forming the bank 180. That is, the pad connection electrode 261 may be formed on the pad 240 and the pad cover electrode 290 may be formed to cover the pad connection electrode 261 using the same number of photo-masks compared to the first embodiment of the present invention. In this way, the corrosion and metal migration of the pad region PA may be prevented without addition of a separate mask, and the reliability and efficiency of production of the organic light emitting display device may be improved.

Figure 6:
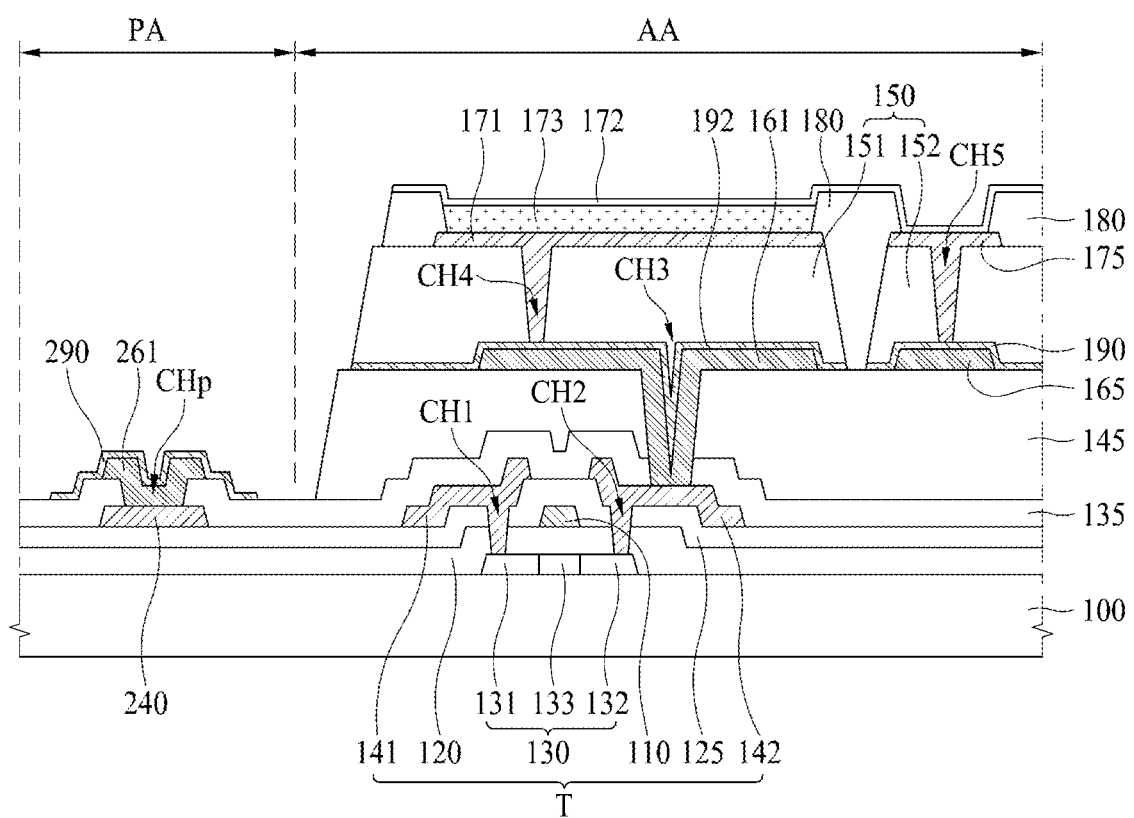
FIG. 6 is a sectional view illustrating an organic light emitting display device in accordance with a third embodiment of the present invention.

FIG. 6 is a sectional view illustrating an organic light emitting display device in accordance with a third embodiment of the present invention. The organic light emitting display device in accordance with the third embodiment of the present invention is the same as that of the above-described second embodiment of the present invention except that the protective layer 150 includes a first protective layer 151 and a second protective layer 152, the connection cover line 192 is provided between the first protective layer 151 and the connection line 161, and an auxiliary cover line 190 is provided between the second protective layer 152 and the auxiliary line 165. Thus, the same components are designated by the same reference numerals, and a repeated description with regard to the materials and configurations of the respective components is omitted.

In the third embodiment of the present invention, the thin film transistor T, the passivation layer 135, the planarization layer 145, the connection line 161, the connection cover line 192, the auxiliary line 165, the auxiliary cover line 190, the protective layer 150, the first electrode 171, the auxiliary electrode 175, the bank 180, the organic emission layer 173, and the second electrode 172 are provided in the pixel area AA on the substrate 100.

The connection cover line 192 is provided on the connection line 161. The connection cover line 192 is configured to cover the upper surface and side surface of the connection line 161.

The auxiliary cover line 190 is provided in the same layer as the connection cover line 192. The auxiliary cover line 190 and the connection cover line 192 are spaced apart from each other. The auxiliary cover line 190 is provided on the auxiliary line 165 and is configured to cover the upper surface and side surface of the auxiliary line 165.

The protective layer 150 includes the first protective layer 151 and the second protective layer 152.

The first protective layer 151 is provided on the connection cover line 192. The first protective layer 151 is configured to cover the upper surface of the connection cover line 192. In this case, the first protective layer 151 does not cover the side surface of the connection cover line 192. As such, the side surface of the connection cover line 192 may be provided so as to be exposed. This will be easily understood with reference to the manufacturing method which will be described below.

The second protective layer 152 is provided on the auxiliary cover line 190. The second protective layer 152 is configured to cover the upper surface of the auxiliary cover line 190. In this case, the second protective layer 152 does not cover the side surface of the auxiliary cover line 190.

The first protective layer 151 and the second protective layer 152 are spaced apart from each other. The bank 180 is provided between the first protective layer 151 and the second protective layer 152 spaced apart from each other as will be described below.

The first electrode 171 is provided on the first protective layer 151, and an auxiliary electrode 175 is disposed on the second protective layer 152.

The bank 180 is provided between the first electrode 171 and the auxiliary electrode 175, thereby insulating the first electrode 171 and the auxiliary electrode 175 from each other. In this case, the bank 180 is provided between the first protective layer 151 and the second protective layer 152, which face each other, thereby insulating the connection cover line 192 disposed below the first protective layer 151 from the auxiliary cover line 190 disposed below the second protective layer 152.

FIGS. 7A to 7D are sectional views illustrating a method of manufacturing the organic light emitting display device in accordance with the third embodiment of the present invention. Thus, the same components are designated by the same reference numerals, and a repeated description with regard to the materials and configurations of the respective components is omitted.

Figure 7A:
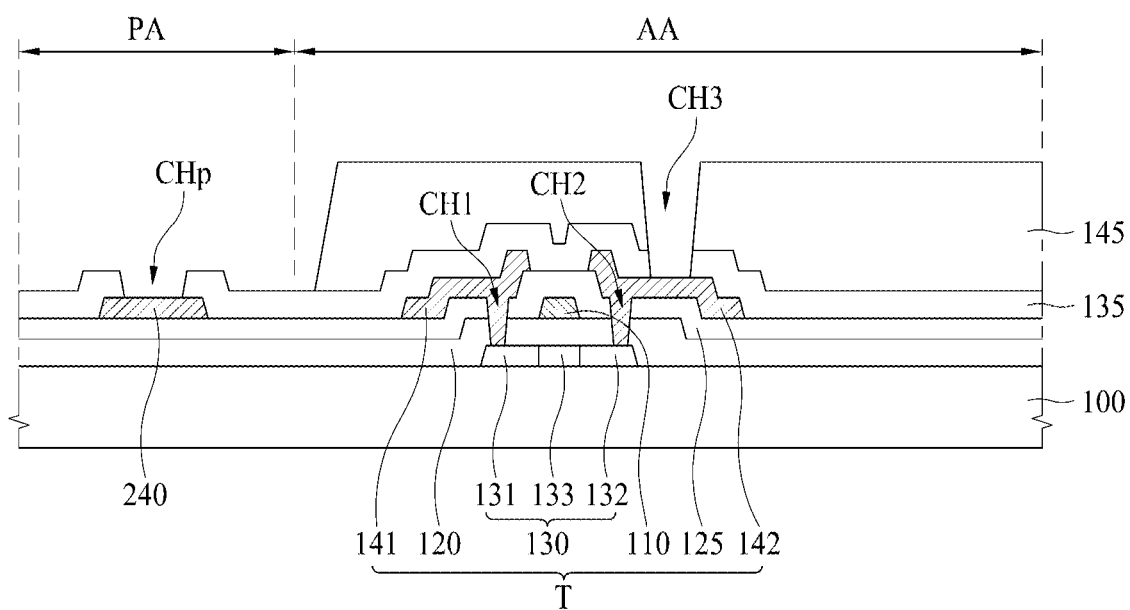
FIGS. 7A to 7D are sectional views illustrating a method of manufacturing the organic light emitting display device in accordance with the third embodiment of the present invention.

First, as can be seen from FIG. 7A, the thin film transistor T is formed in the pixel area AA on the substrate 100 and the pad 240 is formed in the pad area PA on the substrate 100, through the use of the first mask process.

Subsequently, the passivation layer 135 is formed over the entire surface of the pixel area AA including the thin film transistor T and the entire surface of the pad area PA including the pad 240. In this case, the passivation layer 135 has the third contact hole CH3 formed to expose the drain electrode 42 of the thin film transistor T and the pad contact hole CHp formed to expose the pad 240.

Subsequently, the planarization layer 145 is formed on the passivation layer 135 located in the pixel area PA through the use of the third mask process.

Figure 7B:
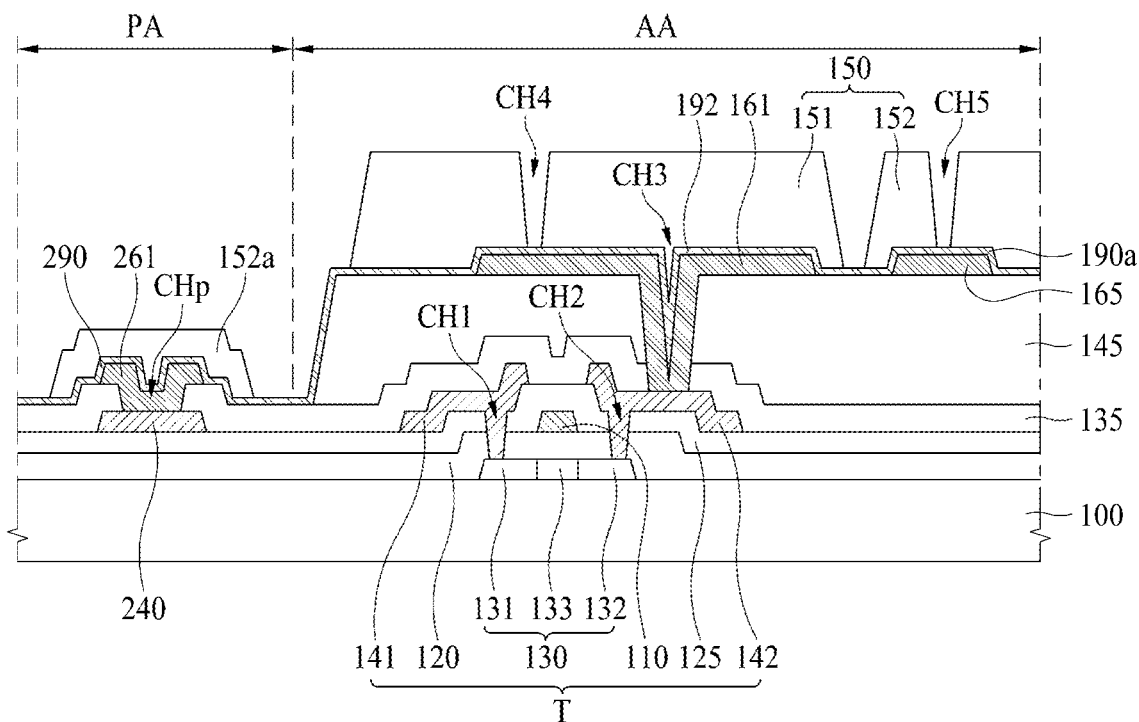

Subsequently, as can be seen from FIG. 7B, the connecting line 161, the auxiliary line 165, and the pad connection electrode 261 are formed through the use of the fourth mask process, and the auxiliary cover line material 190a is applied to the entire surface of the substrate 100.

Subsequently, the first protective layer 151 and the second protective layer 152 spaced apart from the first protective layer 151 are formed in the pixel area AA, and the pad protective pattern 152a is formed in the pad area PA, through the use of the fifth mask process. Here, the first protective layer 151 has the fourth contact hole CH4, and the second protective layer 152 has the fifth contact hole CH5. The first protective layer 151, the second protective layer 152, and the pad protective pattern 152a may be formed using a half-tone mask.

Figure 7C:
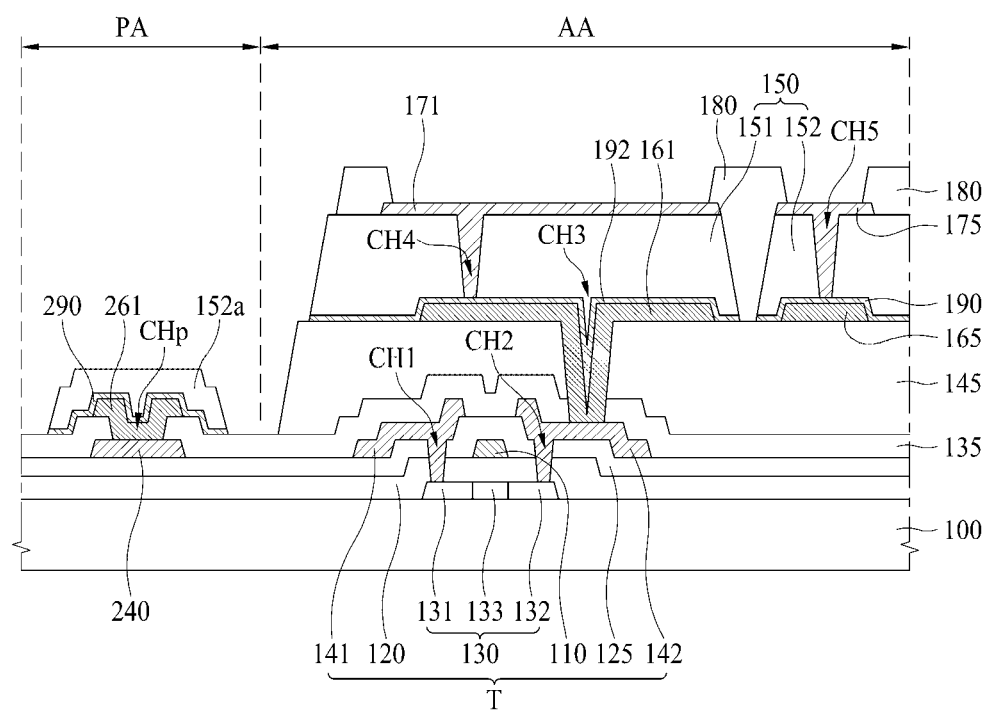

Subsequently, as can be seen from FIG. 7C, the first electrode 171 is formed on the first protective layer 151 and the auxiliary electrode 175 is formed on the second protective layer 152, through the use of the sixth mask process. When the first electrode 171 and the auxiliary electrode 175 are formed, the cover line material 190a located in the pad area PA is simultaneously etched. Thereby, the pad cover electrode 290 is formed in the pad area PA. In addition, when the first electrode 171 and the auxiliary electrode 175 are formed, the cover line material 190a located in the pixel area AA is simultaneously etched, and the connection cover line 192 and the auxiliary cover line 190 are formed in the pixel area AA. In this way, the side surface of the connection cover line 192 may be exposed outward. The connection cover line 192 is formed of a material, the extent of oxidation of which is low, and therefore is not easily corroded even if it is exposed outward.

Subsequently, through the use of the seventh mask process, the bank 180 is formed to separate the first electrode 171 and the auxiliary electrode 175 from each other. In this case, the bank 180 is provided between the first protective layer 151 and the second protective layer 152 to insulate the connection cover line 192 and the auxiliary cover line 190 from each other.

Figure 7D:
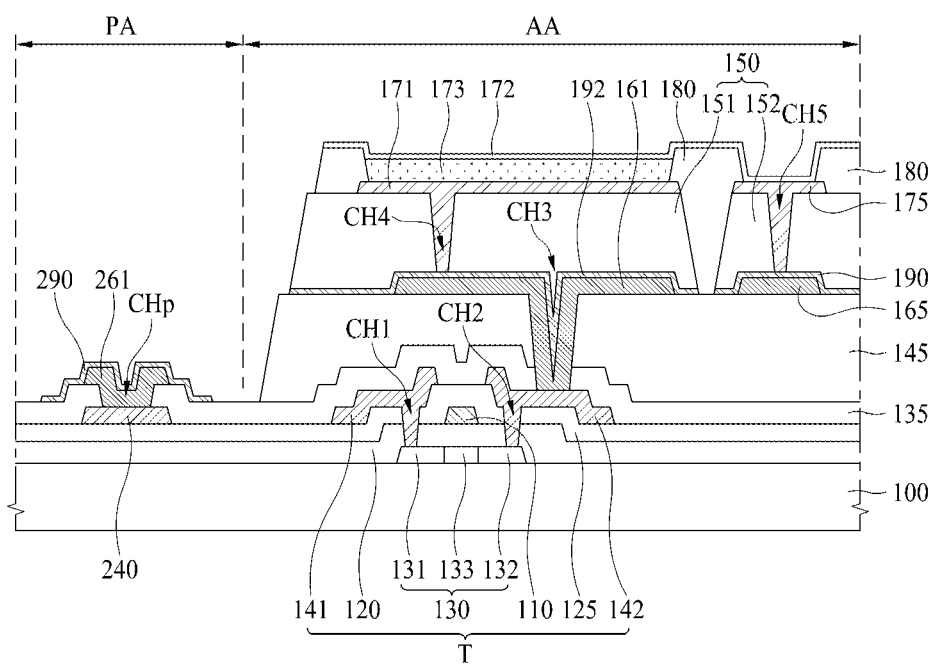

Finally, as can be seen from FIG. 7D, the pad protective pattern 152a is removed, the organic emission layer 173 is formed on the first electrode 171, and the second electrode 172 is formed on the organic emission layer 173.

As described above, in the third embodiment of the present invention, a total of seventh photo-masks are used from the process for forming the source electrode 141 and the drain electrode 172 to the process for forming the bank 180. That is, in the third embodiment of the present invention, the pad connection electrode 261 is formed on the pad 240 and the pad cover electrode 290 is formed to cover the pad connection electrode 261 using a smaller number of photo-masks than that in the first embodiment of the present invention. Thereby, the corrosion and metal migration of the pad area PA may be prevented despite the use of a reduced number of masks.

Figure 8:
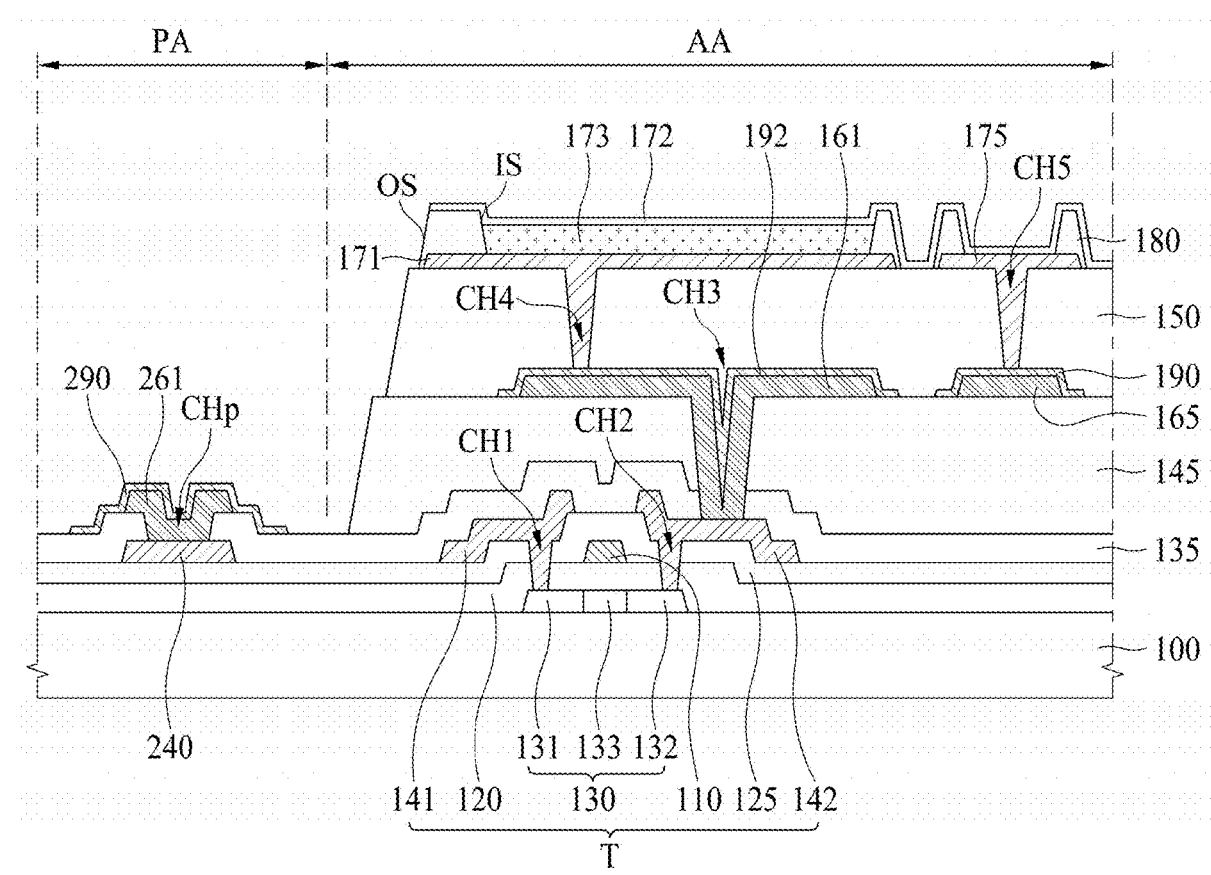
FIG. 8 is a sectional view illustrating an organic light emitting display device in accordance with a fourth embodiment of the present invention.
Figure 9:
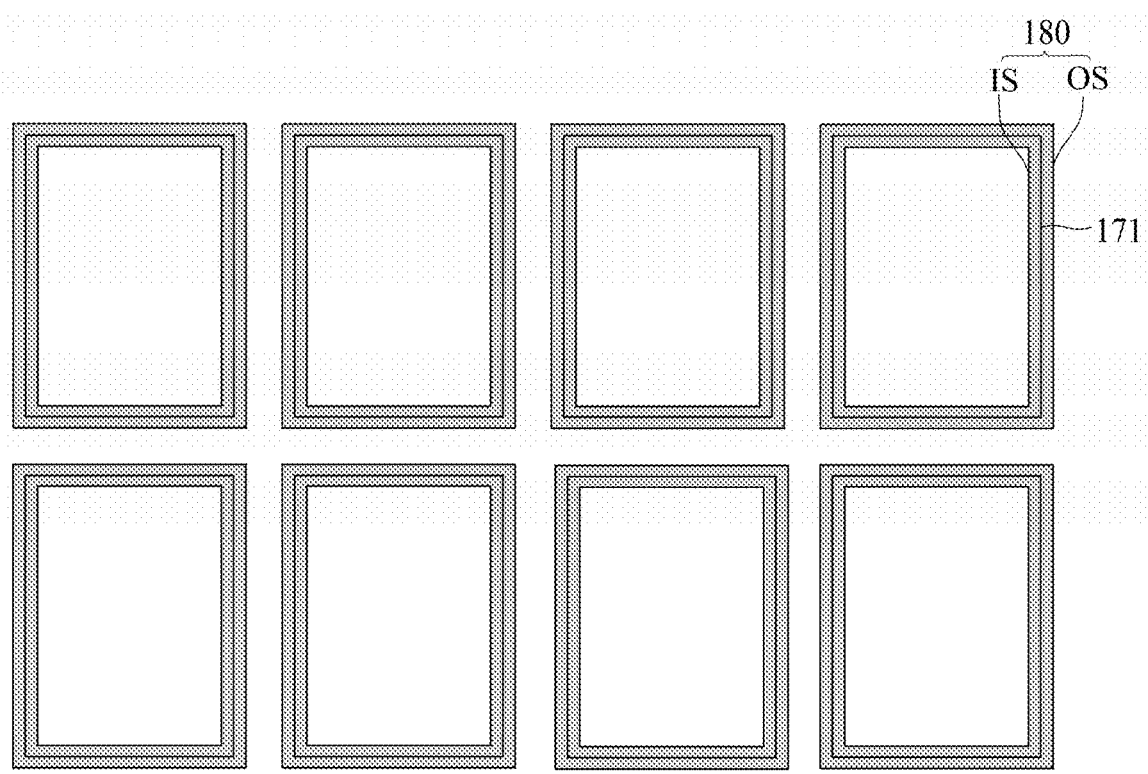
FIG. 9 is a plan view illustrating a bank of FIG. 8 in detail.

FIG. 8 is a sectional view illustrating an organic light emitting display device in accordance with a fourth embodiment of the present invention, and FIG. 9 is a plan view illustrating the bank of FIG. 8 in detail. The organic light emitting display device in accordance with the fourth embodiment of the present invention is the same as that of the second embodiment of the present invention except that the bank 180 is formed along the rim of the first electrode 171. Thus, the same components are designated by the same reference numerals, and a repeated description with regard to the materials and configurations of the respective components is omitted The bank 180, illustrated in FIGS. 8 and 9, has an inner side surface IS spaced inward from the side surface of the first electrode 171 by a given distance, and an outer side surface OS spaced outward from the side surface of the first electrode 171 by a given distance. The bank 180 having the inner side surface IS and the outer side surface OS is formed so as to cover the upper surface and side surface of the first electrode 171 excluding the emission area at which the organic emission layer 173 is formed. Thereby, the bank 180 is formed so as to cover the side surface of the first electrode 171 along the rim of the first electrode 171 excluding the emission area, and thus takes the form of an island having an open emission area.

FIGS. 10A to 10F are sectional views illustrating a method of manufacturing the organic light emitting display device in accordance with the fourth embodiment of the present invention. The first to fifth mask processes of the method of manufacturing the organic light emitting display device in accordance with the fourth embodiment of the present invention are the same as in the second embodiment of the present invention, and thus a detailed description thereto is omitted.

Figure 10A:
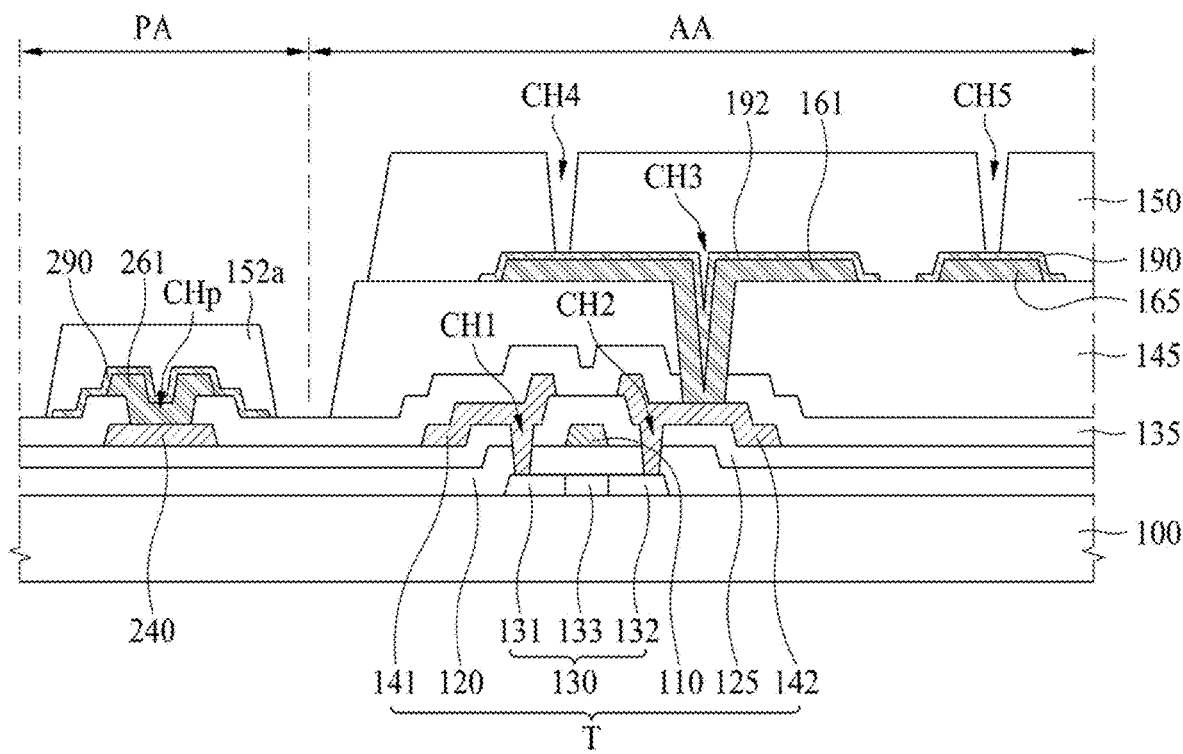
FIGS. 10A to 10F are sectional views illustrating a method of manufacturing the organic light emitting display device in accordance with the fourth embodiment of the present invention.

As illustrated in FIG. 10A, through the use of the sixth mask process, the protective layer 150 is formed in the pixel area AA, and simultaneously the pad protective pattern 152a formed of the same material as the protective layer 150 is formed in the pad area PA. At this time, the protective layer 150 has the fourth contact hole CH4 formed to expose the connection cover line 192 and the fifth contact hole CH5 formed to expose the auxiliary cover line 190.

Figure 10B:
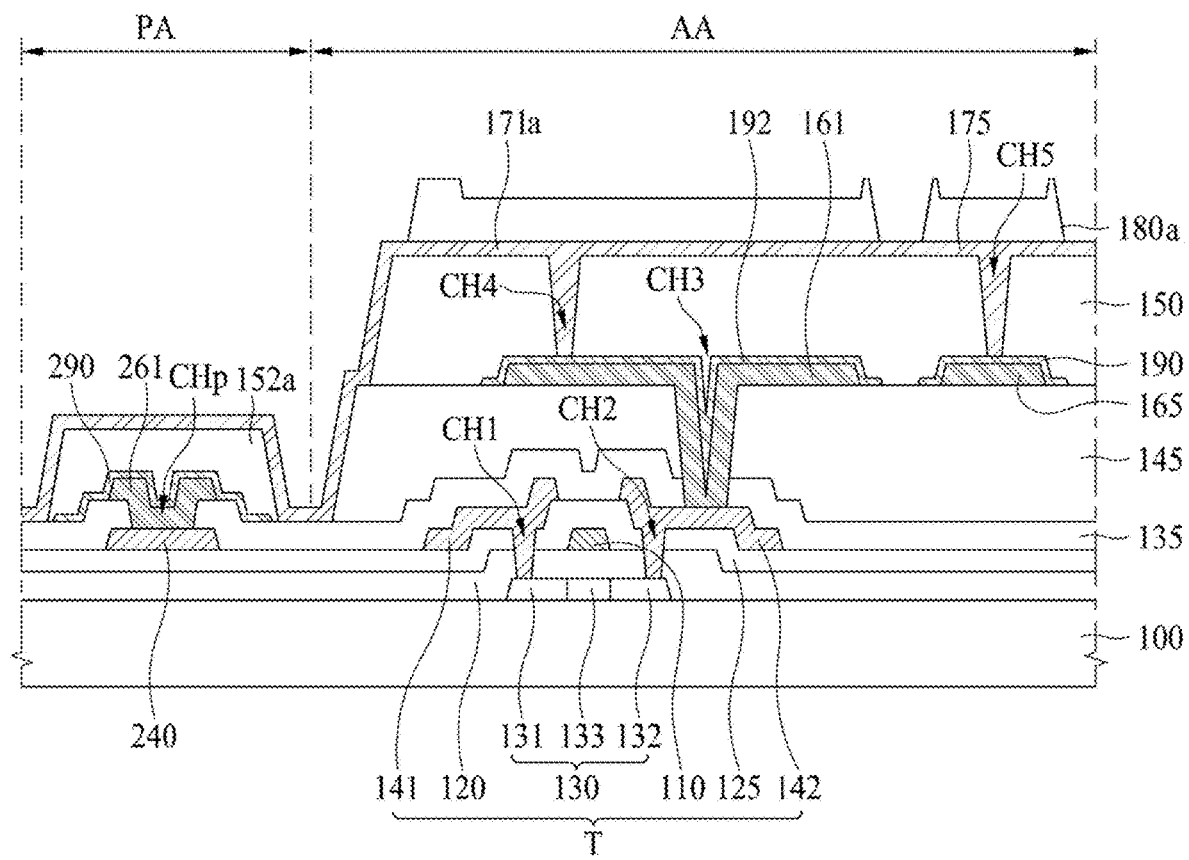

Subsequently, as illustrated in FIG. 10B, a conductive material 171a and a photosensitive film are sequentially formed on the substrate 100 formed with the protective layer 150 and the pad protective pattern 152a. At this time, the conductive material 171a has a multilayer configuration in which a transparent conductive material, a metal material, and a transparent conductive material are sequentially stacked one above another. For example, the conductive material 171a is formed of ITO/Ag alloy/ITO. The photosensitive film is formed of, for example, photoacryl (PAC).

Subsequently, a multistage photosensitive film pattern 180a having different first and second heights is formed in the pixel area AA as the photosensitive film is exposed and developed via a seventh mask process using a half-tone mask or a slit mask. The multistage photosensitive film pattern 180a is formed to a first thickness in a region corresponding to the semi-transmissive portion of the half-tone mask, and is formed to a second thickness, which is thicker than the first thickness, in a region corresponding to the light shielding portion of the half-tone mask. In addition, the photosensitive film pattern 180a is not formed in a region corresponding to the transmissive portion of the half-tone mask because the photosensitive film is removed.

Figure 10C:
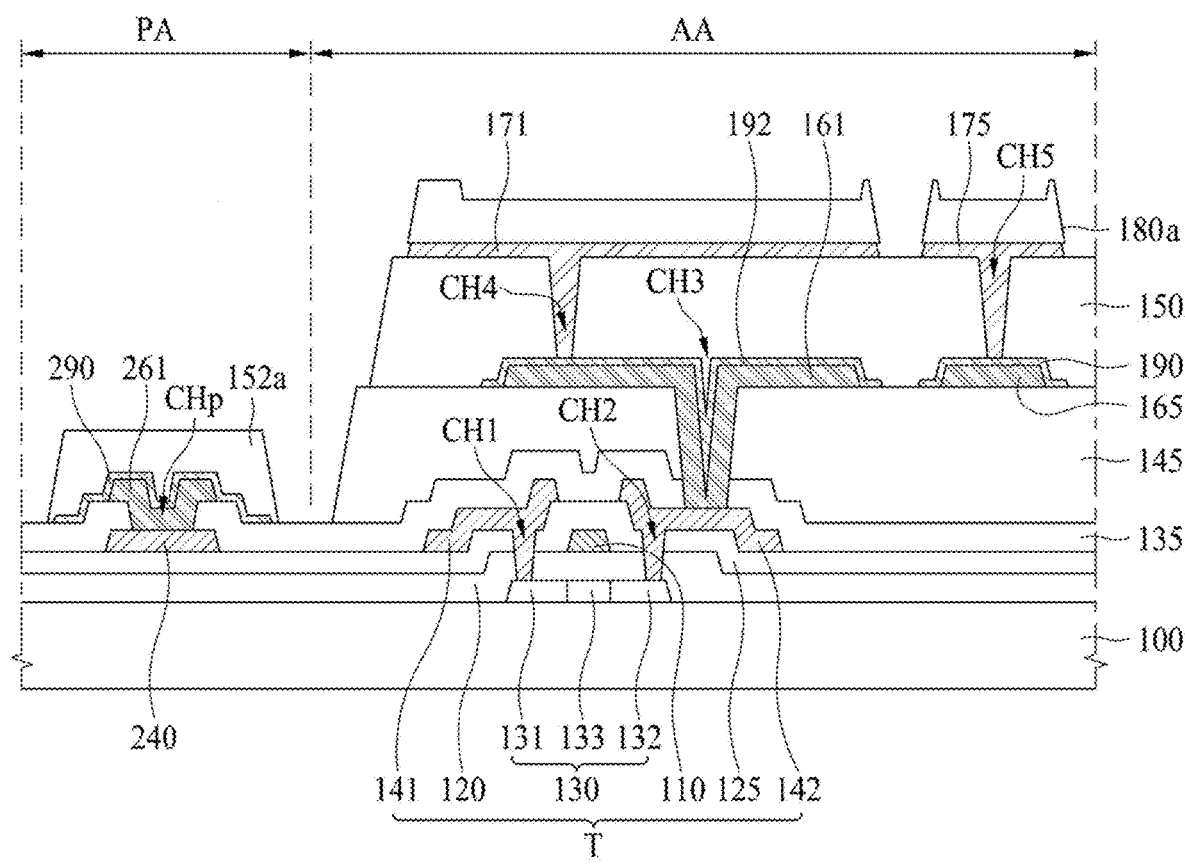

Subsequently, as illustrated in FIG. 10C, the first electrode 171 and the auxiliary electrode 175 are formed by wet-etching the conductive material 171a using the multistage photosensitive film pattern 180a as a mask. During the etching process, since the pad protective pattern 152a covers the pad cover electrode 290, corrosion of the pad cover electrode 290, the pad connection electrode 261, and the pad 240 located in the pad area PA may be prevented.

Figure 10D:
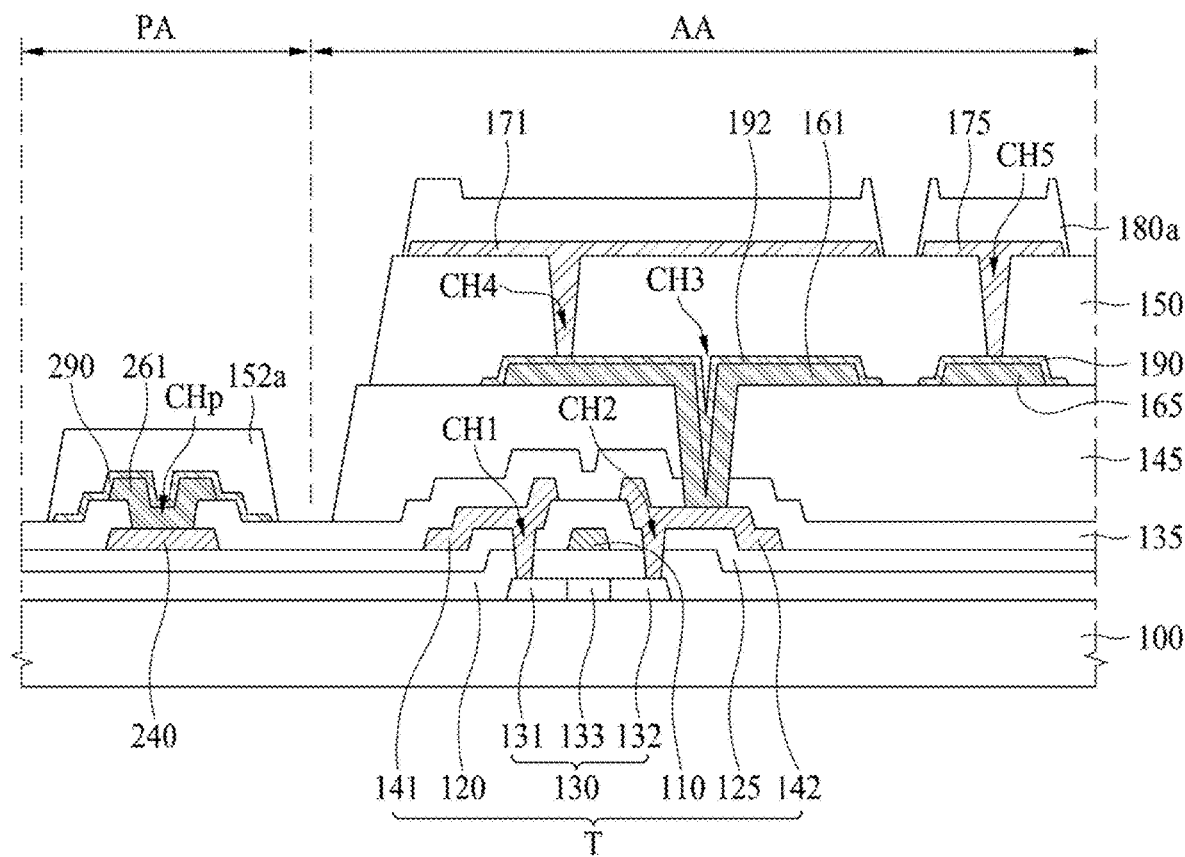

Subsequently, as illustrated in FIG. 10D, as the photosensitive film pattern 180a is made to reflow via a curing process, the photosensitive film pattern 180a is formed to cover the exposed side surfaces of the first electrode 171 and the auxiliary electrode 175. Thereby, it is possible to prevent the first electrode 171 from being electrically short-circuited with the second electrode 172 which will be formed later.

Figure 10E:
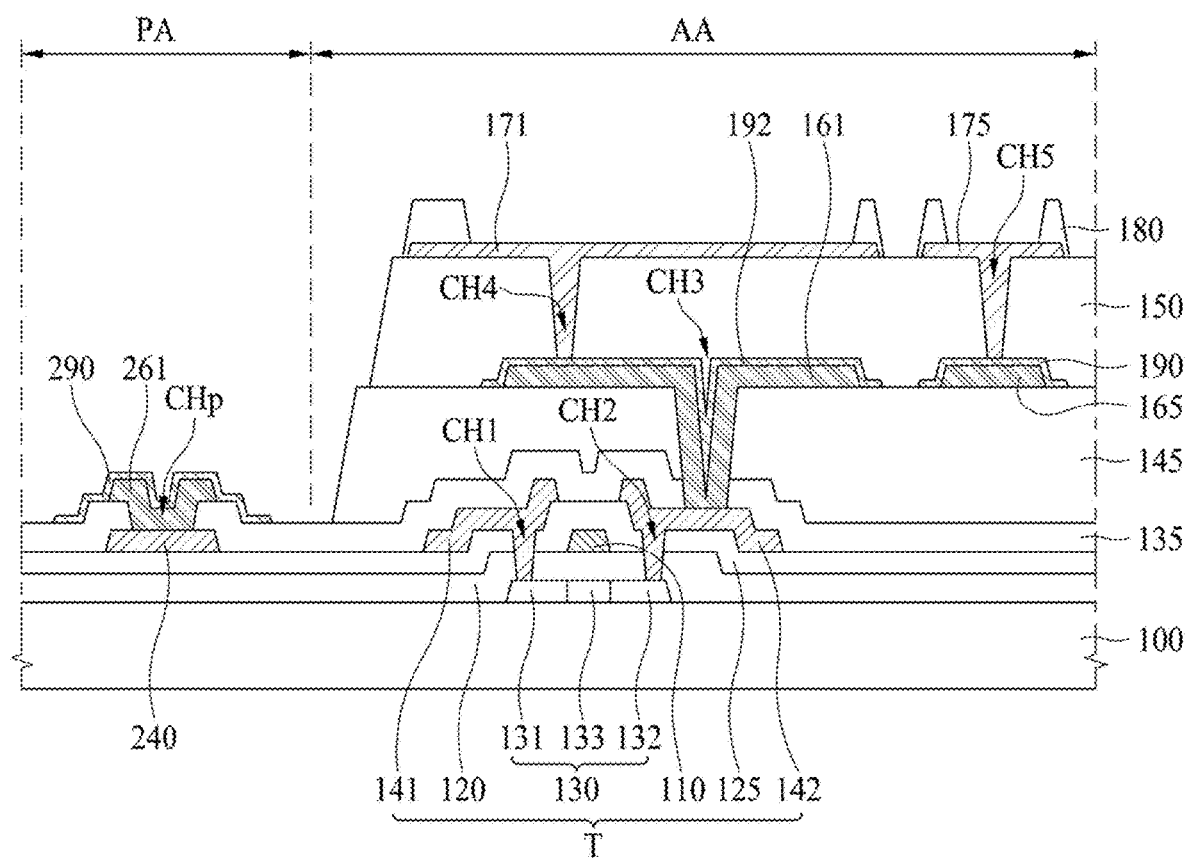

Subsequently, as illustrated in FIG. 10E, the photosensitive film pattern 180a and the pad protective pattern 152a are subjected to ashing or dry-etching. Thereby, the pad protective pattern 152a located in the pad area PA is removed to expose the pad cover electrode 290, and simultaneously the photosensitive film pattern 180a located in the pixel area AA is reduced in thickness to form the bank 180. The bank 180 is formed to cover the side surfaces of the first electrode 171 and the auxiliary electrode 175 along the rims of the first electrode 171 and the auxiliary electrode 175. At this time, the bank 180 exposes the emission area on the first electrode 171, and simultaneously exposes the upper surface of the auxiliary electrode 175 connected to the second electrode 172.

Figure 10F:
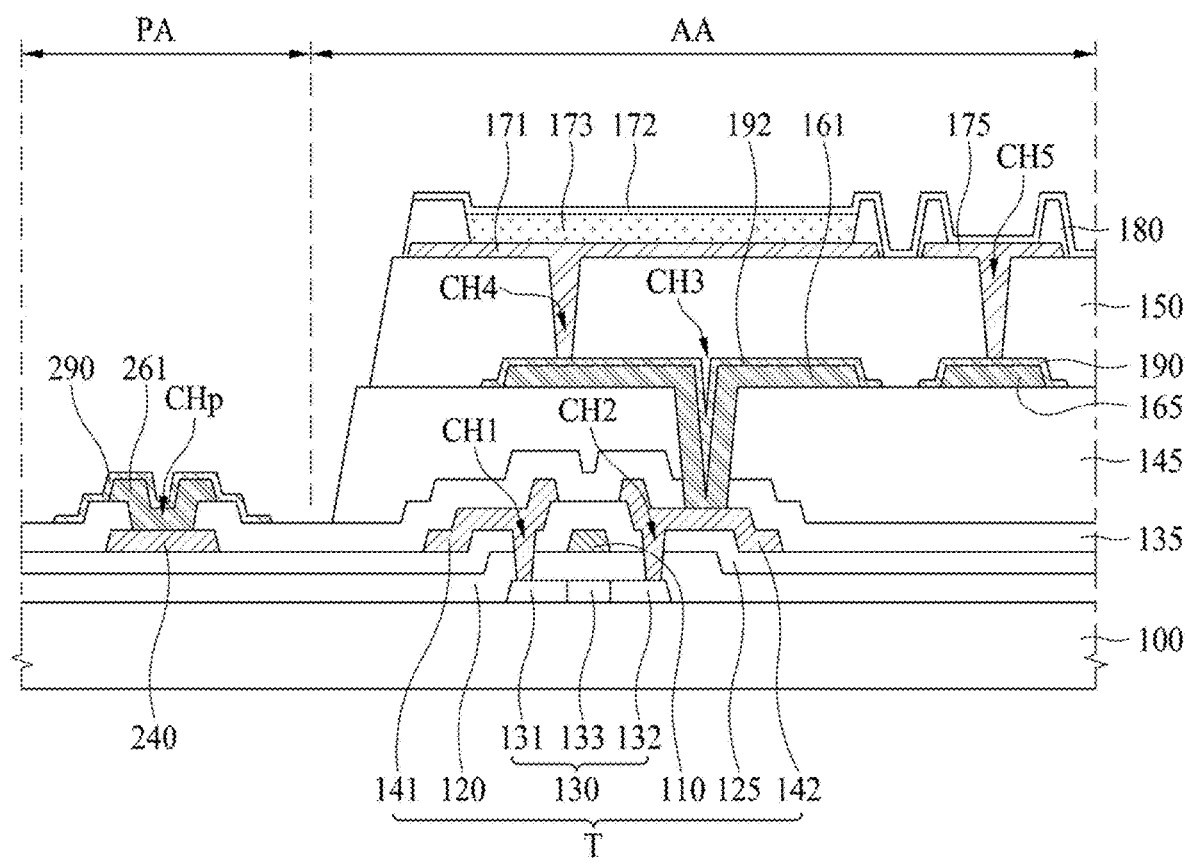

Subsequently, as illustrated in FIG. 10F, the organic emission layer 173 is formed on the emission area of the first electrode 171 exposed by the bank 180, and the second electrode 172 is formed on the organic emission layer 173. At this time, the second electrode 172 is electrically connected to the auxiliary electrode 175, thereby compensating for the resistance of the second electrode 172.

As described above, in the fourth embodiment of the present invention, a total of seventh photo-masks are used from the process for forming the source electrode 141 and the drain electrode 142 to the process for forming the bank 180. That is, in the fourth embodiment of the present invention, the pad connection electrode 261 is formed on the pad 240 and the pad cover electrode 290 is formed to cover the pad connection electrode 261 using a smaller number of photo-masks than that in the first embodiment of the present invention. Thereby, in the fourth embodiment of the present invention, the corrosion and metal migration of the pad area PA may be prevented despite the use of a reduced number of masks. Specifically, in the fourth embodiment of the present invention, since the pad cover electrode 290 may be protected during the etching of the first electrode 171 by the pad protective pattern 152a which is formed at the same time as the protective film 150, the corrosion and metal migration of the pad area PA may be prevented. In addition, in the fourth embodiment of the present invention, since the bank 180 and the first electrode 171 may be formed via the same single mask process, and the pad protective pattern 152a and the protective film 150 may be formed via the same single mask process, the efficiency of production may be improved and the manufacturing costs may be reduced.

As is apparent from the above description, in accordance with embodiments of the present invention, since an auxiliary line is provided below an auxiliary electrode so as to be connected to the auxiliary electrode and is connected to a second electrode via the auxiliary electrode, the resistance of the second electrode may be reduced.

In addition, in accordance with embodiments of the present invention, since a pad connection electrode is provided on a pad and a pad cover electrode is provided so as to cover the upper surface and side surface of the pad connection electrode, no corrosion occurs in a pad electrode, and consequently metal migration may be prevented. In addition, the reliability and the efficiency of production of an organic light emitting display device may be improved without adding a separate mask process.

In addition, in accordance with embodiments of the present invention, since a bank and a first electrode may be formed using the same single mask process, and a pad protective pattern and a protective film may be formed using the same single mask process, the efficiency of production may be improved and the manufacturing costs may be reduced.

It will be apparent to those skilled in the art that various modifications and variations can be made in the organic light emitting display device and the method of manufacturing the same of the present invention without departing from the spirit or scope of the invention. Thus, it is intended that the present invention cover the modifications and variations of this invention provided they come within the scope of the appended claims and their equivalents.

What is claimed is:

1. An organic light-emitting display device comprising:
an organic emission layer disposed on a substrate;
an upper electrode disposed on the organic emission layer;
first and second lower electrodes disposed below the upper electrode, wherein the first lower electrode is connected to a thin-film transistor disposed on the substrate;
a plurality of lower insulation layers disposed between each of the first and second lower electrodes and the substrate;
an auxiliary line connected to the second lower electrode and disposed below the second lower electrode;
an auxiliary cover line disposed to cover an upper surface and a side surface of the auxiliary line;
a connection line configured to interconnect the thin-film transistor and the first lower electrode and disposed in the same layer as the auxiliary line; and
a connection cover line disposed on the connection line to cover an upper surface and a side surface of the connection line and spaced apart from the auxiliary cover line with a trench interposed therebetween,
wherein, at a location between the first and second lower electrodes in a plan view, adjacent ones of the plurality of lower insulation layers each have a side surface such that the side surface of each of the adjacent ones of the plurality of lower insulation layers face each other, and
wherein any one of the plurality of lower insulating layers is disposed on the auxiliary cover line to expose a side surface of the auxiliary cover line.

2. The device according to claim 1, wherein each of the first and second lower electrodes are formed of at least two layers including a transparent conductive material layer and a metal material layer.

3. The device according to claim 1, further comprising an upper insulation layer configured to be in contact with the side surfaces of the adjacent ones of the plurality of lower insulation layers.

4. The device according to claim 1, further comprising an upper insulation layer configured to be in contact with the side surfaces of the adjacent ones of the plurality of lower insulation layers, the upper insulation layer being disposed on a portion of an upper surface and a side surface of each of the first and second lower electrodes.

5. The device according to claim 2, further comprising a plurality of upper insulation layers disposed on opposite side surfaces of each of the first and second lower electrodes,
wherein the upper insulation layers disposed between the first and second lower electrodes are spaced apart from each other.

6. The device according to claim 1, wherein the second lower electrode is an auxiliary electrode that is disposed in the same layer as the first lower electrode and is connected to the upper electrode.

7. The device according to claim 6, wherein the plurality of lower insulation layers comprises:
a first protective layer disposed between the first lower electrode and the connection line; and
a second protective layer disposed between the auxiliary electrode and the auxiliary line, and
wherein side surfaces of the first and second protective layers exposed between the first lower electrode and the auxiliary electrode face each other.

8. The device according to claim 7, further comprising an upper insulation layer disposed between the first and second protective layers that face each other.

9. An organic light-emitting display device comprising:
an organic emission layer disposed on a substrate;
an upper electrode disposed on the organic emission layer;
a plurality of lower electrodes disposed below the upper electrode;
a plurality of lower insulation layers disposed between the plurality of lower electrodes and the substrate;
a trench located between the plurality of lower electrodes, in a plan view, in a lower insulation layer among the plurality of lower insulation layers;
an auxiliary line connected to one lower electrode of the plurality of lower electrodes and disposed below the one lower electrode;
an auxiliary cover line disposed to cover an upper surface and a side surface of the auxiliary line;
a connection line configured to interconnect other lower electrode of the plurality of lower electrodes and a thin-film transistor and disposed in the same layer as the auxiliary line; and
a connection cover line disposed on the connection line to cover an upper surface and a side surface of the connection line and spaced apart from the auxiliary cover line with the trench interposed therebetween,
wherein any one of the plurality of lower insulating layers is disposed on the auxiliary cover line to expose a side surface of the auxiliary cover line.

10. The device according to claim 9, wherein the plurality of lower electrodes comprises:
a first lower electrode being the other lower electrode of the plurality of lower electrodes and connected to the thin-film transistor; and
a second lower electrode being the one lower electrode of the plurality of lower electrodes and disposed in the same layer as the first lower electrode.

11. The device according to claim 10, wherein each of the first and second lower electrodes are formed of at least two layers including a transparent conductive material layer and a metal material layer.

12. The device according to claim 10, further comprising an upper insulation layer disposed in the trench.

13. The device according to claim 10, further comprising an upper insulation layer configured to be in contact with a side surface of the trench.

14. The device according to claim 13, wherein the upper insulation layer is disposed on a portion of an upper surface and a side surface of the first and second lower electrodes.

15. The device according to claim 10, further comprising a plurality of upper insulation layers disposed on opposite side surfaces of each of the first and second lower electrodes,
wherein the upper insulation layers disposed between the first and second lower electrodes are spaced apart from each other.

16. The device according to claim 9, wherein the trench is directed from an upper surface of the lower insulation layer towards the substrate.

17. The device according to claim 12, wherein the first lower electrode faces the upper electrode with the organic emission layer interposed therebetween, and
wherein the second lower electrode is an auxiliary electrode that is connected to the upper electrode.

18. The device according to claim 17, wherein the plurality of lower insulation layers comprises:
a first protective layer disposed between the first lower electrode and the connection line; and
a second protective layer disposed between the auxiliary electrode and the auxiliary line, and
wherein side surfaces of the first and second protective layers face each other with the upper insulation layer, disposed in the trench, interposed therebetween.

* * * * *